(12) United States Patent
Kim et al.

(10) Patent No.: US 9,437,625 B2
(45) Date of Patent: Sep. 6, 2016

(54) DISPLAY PANEL AND METHOD OF MANUFACTURING THE SAME

(71) Applicant: SAMSUNG DISPLAY CO., LTD., Yongin, Gyeonggi-Do (KR)

(72) Inventors: Ka-Eun Kim, Seoul (KR); Jang-Wi Ryu, Seoul (KR); Ho-Kil Oh, Yongin-si (KR); Se-Hyun Lee, Seoul (KR); Ki-Chul Shin, Seongnam-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 320 days.

(21) Appl. No.: 14/159,915

(22) Filed: Jan. 21, 2014

(65) Prior Publication Data

US 2015/0062474 A1   Mar. 5, 2015

(30) Foreign Application Priority Data

Aug. 28, 2013 (KR) ........................ 10-2013-0102500

(51) Int. Cl.
| | |
|---|---|
| *G02F 1/136* | (2006.01) |
| *H01L 27/12* | (2006.01) |
| *G02F 1/1337* | (2006.01) |
| *G02F 1/1362* | (2006.01) |
| *G02F 1/1335* | (2006.01) |
| *G02F 1/1343* | (2006.01) |

(52) U.S. Cl.
CPC ..... *H01L 27/1259* (2013.01); *G02F 1/133707* (2013.01); *G02F 1/133512* (2013.01); *G02F 1/133753* (2013.01); *G02F 1/136286* (2013.01); *G02F 2001/134345* (2013.01); *G02F 2001/136218* (2013.01); *G02F 2001/136222* (2013.01)

(58) Field of Classification Search
CPC .................. G02F 1/1368; G02F 1/133514
USPC ............................................... 349/43; 438/29
See application file for complete search history.

(56) References Cited

U.S. PATENT DOCUMENTS

| | | | | |
|---|---|---|---|---|
| 5,757,451 | A  * | 5/1998 | Miyazaki | ............ G02F 1/13394 349/106 |
| 6,281,955 | B1 * | 8/2001 | Midorikawa | ..... G02F 1/133514 349/106 |

(Continued)

FOREIGN PATENT DOCUMENTS

| | | |
|---|---|---|
| KR | 1020080028565 | 4/2008 |
| KR | 1020080039043 | 5/2008 |

*Primary Examiner* — Lucy Chien
(74) *Attorney, Agent, or Firm* — F. Chau & Associates, LLC

(57) ABSTRACT

A display panel includes a first pixel electrode electrically connected to a first switching electrode, and includes a plurality of first branches forming micro slits, a second pixel electrode electrically connected to a second switching electrode, and including a plurality of second branches forming micro slits, and a third pixel electrode electrically connected to a third switching electrode, and including a plurality of third branches forming micro slits. The first branches are spaced apart from each other by a first space, and have a first width. The second branches are spaced apart from each other by a second space, and have a second width. The third branches are spaced apart from each other by a third space, and have a third width. At least one of the first width, the second width and the third width is different from the other widths.

23 Claims, 17 Drawing Sheets

(56) References Cited

U.S. PATENT DOCUMENTS

| | | |
|---|---|---|
| 6,466,288 B1 | 10/2002 | Rho |
| 6,998,217 B2 | 2/2006 | Martyniuk et al. |
| 2004/0227774 A1* | 11/2004 | Matsumoto .............. G09G 3/20 345/690 |
| 2011/0164198 A1* | 7/2011 | Shin .................... G02F 1/13624 349/46 |
| 2012/0133854 A1 | 5/2012 | Itoh et al. |
| 2013/0021567 A1 | 1/2013 | Gu et al. |
| 2013/0293822 A1* | 11/2013 | Chung .............. G02F 1/133707 349/144 |

* cited by examiner

DISPLAY PANEL AND METHOD OF MANUFACTURING THE SAME

CROSS-REFERENCE TO RELATED APPLICATIONS

This application claims priority to Korean Patent Application No. 10-2013-0102500, filed on Aug. 28, 2013, the disclosure of which is hereby incorporated by reference herein in its entirety.

1. TECHNICAL FIELD

The present disclosure relates to a display panel and a method of manufacturing the display panel.

More particularly, the present disclosure relates to a display panel for a liquid crystal display apparatus and a method of manufacturing the display panel.

2. DISCUSSION OF THE RELATED ART

Recently, a liquid crystal display apparatus having light weight and small size has been manufactured. A cathode ray tube (CRT) display apparatus has been used due to its performance and competitive price. However, the CRT display apparatus may have difficulties with regard to its size or portability. Therefore, the liquid crystal display apparatus has been highly regarded due to its small size, light weight and low power consumption.

The liquid crystal display apparatus includes a pixel electrode, a common electrode facing the pixel electrode, and a liquid crystal layer disposed between the pixel electrode and the common electrode. A texture may be formed at a display area on which an image is displayed, so that the traditional liquid crystal display apparatus may have difficulty with regard to degradation of its display quality due to the texture.

SUMMARY

Exemplary embodiments of the invention provide a display panel capable of increasing display quality.

Exemplary embodiments of the invention also provide a method of manufacturing the display panel.

According to an exemplary embodiment of the invention, a display panel includes a first data line, a second data line spaced apart from the first data line, a third data line spaced apart from the first data line, a first switching electrode electrically connected to the first data line, a second switching electrode electrically connected to the second data line, a third switching electrode electrically connected to the third data line, a first pixel electrode electrically connected to the first switching electrode, and including a plurality of first branches forming micro slits, a second pixel electrode electrically connected to the second switching electrode, and including a plurality of second branches forming micro slits, and a third pixel electrode electrically connected to the third switching electrode, and including a plurality of third branches forming micro slits. The first branches are spaced apart from each other by a first space, and have a first width. The second branches are spaced apart from each other by a second space, and have a second width. The third branches are spaced apart from each other by a third space, and have a third width. At least one of the first width, the second width and the third width is different from the other widths.

In an exemplary embodiment, the first width may be smaller than the second width and the third width.

In an exemplary embodiment, the second width may be substantially the same as the third width.

In an exemplary embodiment, a first pitch may be defined by a sum of the first space and the first width. A second pitch may be defined by a sum of the second space and the second width, a third pitch is defined by a sum of the third space and the third width. The first pitch, the second pitch and the third pitch may be substantially the same as each other.

In an exemplary embodiment, the first, second and third pitch may be about 6 μm (micrometer). The first width is about 3.4 μm, and the second and third width may be about 3.5 μm.

In an exemplary embodiment, the first pixel electrode may include a first stem extending in a first direction and a second stem crossing the first stem and extending in a second direction which is substantially perpendicular to the first direction. The first branches may extend from the first stem or second stem in a third direction which is different from the first and second directions. The second pixel electrode may include a first stem extending the first direction and a second stem crossing the first stem and extending in the second direction. The second branches may extend from the first stem or second stem in the third direction. The third pixel electrode may include a first stem extending in the first direction and a second stem crossing the first stem and extending in the second direction. The third branches may extend from the first stem or second stem in the third direction.

In an exemplary embodiment, ends of an adjacent pair of the first branches may be connected with each other at a boundary of the first pixel electrode such that the ends of the adjacent pair of first branches form a closed structure.

In an exemplary embodiment, ends of an adjacent pair of the first branches at a boundary of the first pixel electrode may be spaced apart from each other such that the ends of the adjacent pair of the first branches form an opened structure.

In an exemplary embodiment, the first branches of the closed structure adjacent to each other may form an opening. A side of opening which may be adjacent to the boundary of the first pixel electrode makes a first angle with a line which extends along the boundary of the first pixel electrode.

In an exemplary embodiment, the display panel may further include a first color filter overlapping with the first pixel electrode and having a first color, a second color filter overlapping the second pixel electrode and having a second color different from the first color, and a third color filter overlapping with the third pixel electrode and having a third color different from the first and second colors.

In an exemplary embodiment, a boundary of the second color filter may overlap with a first boundary of the first color filter. A boundary of the third color filter may overlap with a second boundary of the first color filter. The second boundary may be disposed opposite to the first boundary of the first color filter.

In an exemplary embodiment, the first color of the first color filter may be red.

In an exemplary embodiment, the first color filter may have a first thickness. The second color filter may have a second thickness. The third color filter has a third thickness. The first thickness may be smaller than the second and third thickness.

In an exemplary embodiment, the first data line may include a first high data line and a first low data line, the second data line comprises a second high data line and a second low data line, the third data line comprises a third high data line and a third low data line. The first switching element may include a first high switching element electrically connected to the first high data line and a first low switching element electrically connected to the first low data line. The second switching element may include a second high switching element electrically connected to the second high data line and a second low switching element electrically connected to the second low data line. The third switching element may include a third high switching element electrically connected to the third high data line and a third low switching element electrically connected to the third low data line. The first pixel electrode may include a first high pixel electrode electrically connected to the first high switching element and a first low pixel electrode electrically connected to the first low switching element. The second pixel electrode may include a second high pixel electrode electrically connected to the second high switching element and a second low pixel electrode electrically connected to the second low switching element. The third pixel electrode may include a third high pixel electrode electrically connected to the third high switching element and a third low pixel electrode electrically connected to the third low switching element.

In an exemplary embodiment, the display panel may include a shielding electrode disposed between the first pixel electrode, the second pixel electrode and the third pixel electrode, and the shielding electrode may overlap with the first data line, the second data line and the third data line.

According to another exemplary embodiment of the invention, a method of manufacturing a display panel includes forming a first switching element, a second switching element, and a third switching element on a base substrate, and forming a first pixel electrode, a second pixel electrode and a third pixel electrode which are respectively connected to the first switching element, the second switching element and the third switching element on the base substrate on which the first switching element, the second switching element and the third switching elements are formed. The first pixel electrode includes a plurality of first branches having a first width. The first branches are spaced apart from each other by a first space. The second pixel electrode includes a plurality of second branches having a second width. The second branches are spaced apart from each other by a second space. The third pixel electrode may include a plurality of third branches having a third width. The third branches are spaced apart from each other by a third space.

In an exemplary embodiment, the first width may be smaller than the second width and the third width.

In an exemplary embodiment, ends of an adjacent pair of the first branches may be connected with each other at a boundary of the first pixel electrode such that the ends of the adjacent pair of the first branches form a closed structure.

In an exemplary embodiment, ends of an adjacent pair of the first branches at a boundary of the first pixel electrode may be spaced apart from each other such that the ends of the adjacent pair of the first branches form an opened structure.

In an exemplary embodiment, before the forming of the first pixel electrode, the second pixel electrode, and the third pixel electrode, the method may further includes forming a first color filter corresponding to the first pixel electrode on the base substrate on which the first pixel electrode, the second pixel electrode, and the third pixel electrode are formed, and the first color filter has a first color, and forming a second color filter corresponding to the second pixel electrode on the base substrate on which the first color filter is formed, and the second color filter has a second color, and forming a third color filter corresponding to the third pixel electrode on the base substrate on which the first color filter and the second color filter are formed. The third color filter has a second color.

In an exemplary embodiment, a boundary of the second color filter may overlap with a first boundary of the first color filter. A boundary of the third color filter may overlap with a second boundary of the first color filter. The second boundary may be disposed opposite to the first boundary of the first color filter.

In an exemplary embodiment, the first color filter may have a first thickness. The second color filter may have a second thickness. The third color filter may have a third thickness. The first thickness may be smaller than the second thickness and the third thickness.

In accordance with an exemplary embodiment, a display panel is provided. The display panel includes a first data line, a second data line spaced apart from the first data line, a third data line spaced apart from the first data line, a first switching electrode electrically connected to the first data line, a second switching electrode electrically connected to the second data line, a third switching electrode electrically connected to the third data line, a first pixel electrode electrically connected to the first switching electrode, and including a plurality of first branches forming micro slits, in which the first branches include a first sub-branch and a second sub-branch connected to each other at a boundary of the first pixel electrode such that a first opening is defined between the first sub-branch and the second sub-branch and in which a side of the first opening which is adjacent to the boundary of the first pixel electrode makes a first angle with a line extending along the boundary of the first pixel electrode, and in which the first sub-branches and the second sub-branches of the first branches of the first pixel electrode are spaced apart from adjacent first and second sub-branches of the first pixel electrode by a first space, and have a first width.

In addition, the display panel further includes a second pixel electrode electrically connected to the second switching electrode, and includes a plurality of second branches forming micro slits, in which the second branches include a first sub-branch and a second sub-branch connected to each other at a boundary of the second pixel electrode such that a second opening is defined between the first sub-branch and the second sub-branch and in which a side of the second opening which is adjacent to the boundary of the second pixel electrode makes a second angle with a line extending along the boundary of the second pixel electrode, and in which the first sub-branches and the second sub-branches of the second branches of the second pixel electrode are spaced apart from adjacent first and second sub-branches of the second pixel electrode by a second space, and have a second width.

Also, the display panel further includes a third pixel electrode electrically connected to the third switching electrode, and including a plurality of third branches forming micro slits, in which the third branches include a first sub-branch and a second sub-branch connected to each other at a boundary of the third pixel electrode such that a third opening is defined between the first sub-branch and the second sub-branch and in which a side of the third opening which is adjacent to the boundary of the third pixel electrode makes a third angle with a line extending along the boundary of the third pixel electrode, and in which the first sub-branches and the second sub-branches of the third branches of the third pixel electrode are spaced apart from adjacent first and second sub-branches of the third pixel electrode by a third space, and have a third width.

At least one of the first width, the second width and the third width is different from the other widths.

According to the exemplary embodiments of the present invention, a display panel includes a first pixel electrode including branches having a first width, a second pixel electrode including branches having a second width, and a third pixel electrode including branches having a third width. The first width is smaller than the second width or the third width, so that a texture formed at the boundary of the first pixel electrode may be decreased. Thus, the display quality of the display panel may be increased.

In addition, the display panel includes a first color filter corresponding to the first pixel electrode, a second color filter corresponding to the second pixel electrode and a third color filter corresponding to the third pixel electrode. The first width of the first pixel electrode is smaller than the second width or the third width, so that a texture formed at the boundary of the first pixel electrode may be decreased. Thus, the display quality of the display panel may be increased.

In addition, a boundary shape of the first pixel electrode, the second pixel electrode and the third pixel electrode has open or closed structure, so that a texture at the display area of the display panel may be decreased. Thus, the display quality of the display panel may be increased.

In addition, the first pixel electrode, the second pixel electrode and the third pixel electrode include a sloped side having a first angle at a boundary of the pixel electrode, so that a texture at the display area of the display panel may be decreased. Thus, the display quality of the display panel may be increased.

BRIEF DESCRIPTION OF THE DRAWINGS

Exemplary embodiments of the invention can be understood in more detail from the following detailed description taken in conjunction with the accompanying drawings, in which.

DETAILED DESCRIPTION OF EXEMPLARY EMBODIMENTS

Hereinafter, exemplary embodiments of the invention will be explained in detail with reference to the accompanying drawings.

Figure 1:
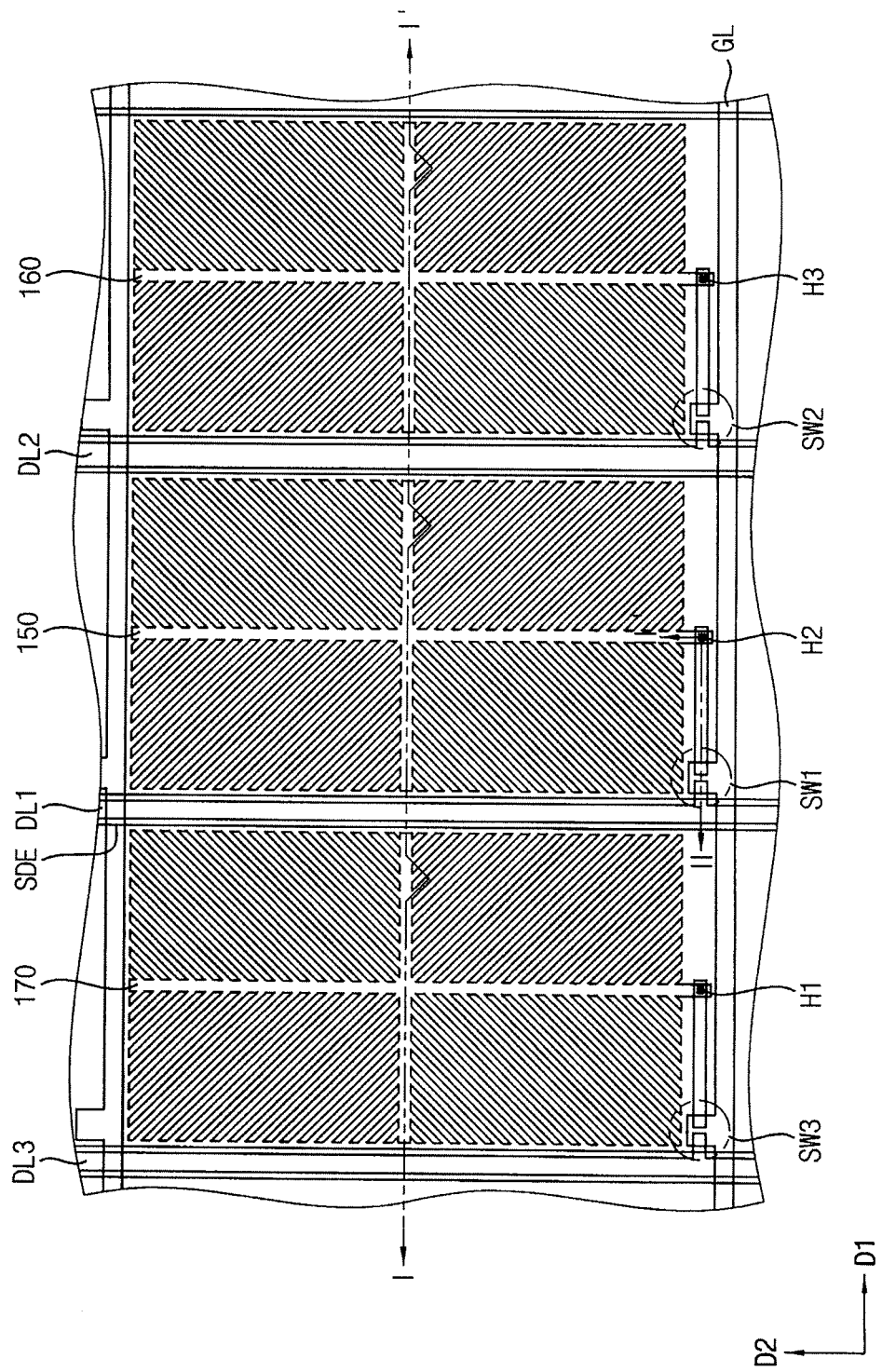
FIG. 1 is a plan view illustrating a display panel according to an exemplary embodiment of the invention.

FIG. 1 is a plan view illustrating a display panel according to an exemplary embodiment of the invention. The display panel includes, for example, a plurality of unit pixels, and one of the unit pixels including first to third pixels is described in the figure.

Referring to FIG. 1, a display panel includes, for example, a gate line GL, a first data line DL1, a second data line DL2, a third data line DL3, a first switching element SW1, a second switching element SW2, a third switching element SW3, a first pixel electrode 150, a second pixel electrode 160, a third pixel electrode 170 and a shielding electrode SDE.

The gate line GL extends, for example, in a first direction D1. The gate line GL is electrically connected to a first gate electrode of the first switching element SW1, a second gate electrode of the second switching element SW2 and a third gate electrode of the third switching element SW3. A gate signal is applied to the gate line GL.

The first data line DL1 extends, for example, in a second direction D2 which is substantially perpendicular to the first direction D1. The first data line DL1 crosses the gate line GL. The first data line DL1 is electrically connected to a first source electrode of the first switching element SW1. A first data signal is applied to the first data line DL1.

The second data line DL2 extends, for example, in the second direction D2, and is spaced apart from the first data line DL1. The second data line DL2 crosses the gate line GL. The second data line DL2 is electrically connected to a second source electrode of the second switching element SW2. A second data signal is applied to the second data line DL2.

The third data line DL3 extends, for example, in the second direction D2, and is spaced apart from the first data line DL1. The third data line DL3 crosses the gate line GL. The third data line DL3 is electrically connected to a third source electrode of the third switching element SW3. The third data line DL3 is, for example, disposed opposite to the second data line DL2 with reference to the first data line DL1. A third data signal is applied to the third data line DL3.

The first switching element SW1 includes, for example, the first gate electrode, a first source electrode, a first drain electrode and a first channel layer. The first gate electrode is electrically connected to the gate line GL. The first source electrode is electrically connected to the first data line DL1. The first drain electrode is electrically connected to the first pixel electrode 150 through a first contact hole H1. A detailed explanation about the first switching element SW1 will be mentioned in connection with FIG. 3.

The second switching element SW2 includes, for example, the second gate electrode, a second source electrode, a second drain electrode and a second channel layer. The second gate electrode is electrically connected to the gate line GL. The second source electrode is electrically connected to the second data line DL2. The second drain electrode is electrically connected to the second pixel electrode 160 through a second contact hole H2.

The third switching element SW3 includes, for example, the third gate electrode, a third source electrode, a third drain electrode and a third channel layer. The third gate electrode is electrically connected to the gate line GL. The third source electrode is electrically connected to the third data line DL3. The third drain electrode is electrically connected to the third pixel electrode 170 through a third contact hole H3.

The first pixel electrode 150 is disposed adjacent to the gate line GL, and disposed between the first data line DL1 and the second data line DL2. The first pixel electrode 150 includes, for example, a plurality of branches forming a micro-slit pattern. A detailed explanation about the first pixel electrode 150 will be mentioned in connection with FIG. 4.

The second pixel electrode 160 is disposed adjacent to the gate line GL, and disposed between the second data line DL2 and a third data line DL3 of an adjacent unit pixel in the second direction D2. The second pixel electrode 160 includes, for example, a plurality of branches forming a micro-slit pattern. A detailed explanation about the second pixel electrode 160 will be mentioned in connection with FIG. 5.

The third pixel electrode 170 is disposed adjacent to the gate line GL, and disposed between the second data line DL2 and the third data line DL3. The third pixel electrode 170 includes, for example, a plurality of branches forming a micro-slit pattern. The third pixel electrode 170 is substantially the same as the second pixel electrode 160, so that a detailed explanation about the third pixel electrode 170 will be mentioned referring to FIG. 5.

The shielding electrode SDE extends, for example, in the second direction D2, and overlaps the first to third data lines DL1, DL2 and DL3. A shielding voltage is applied to the shielding electrode SDE. For example, a common voltage which is applied to a common electrode (e.g., refers to 220 of FIG. 2) may be applied to the shielding electrode SDE.

Figure 2:
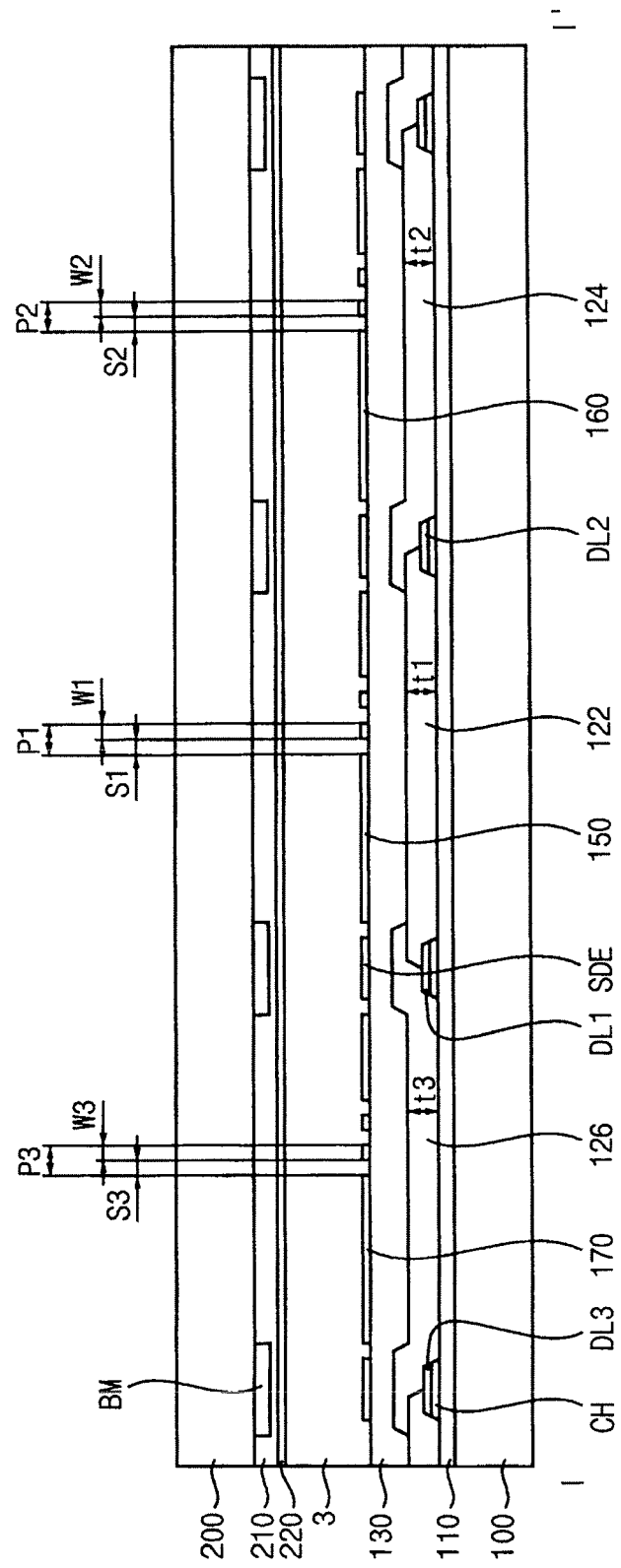
FIG. 2 is a cross-sectional view taken along a line I-I' of FIG. 1.
Figure 3:
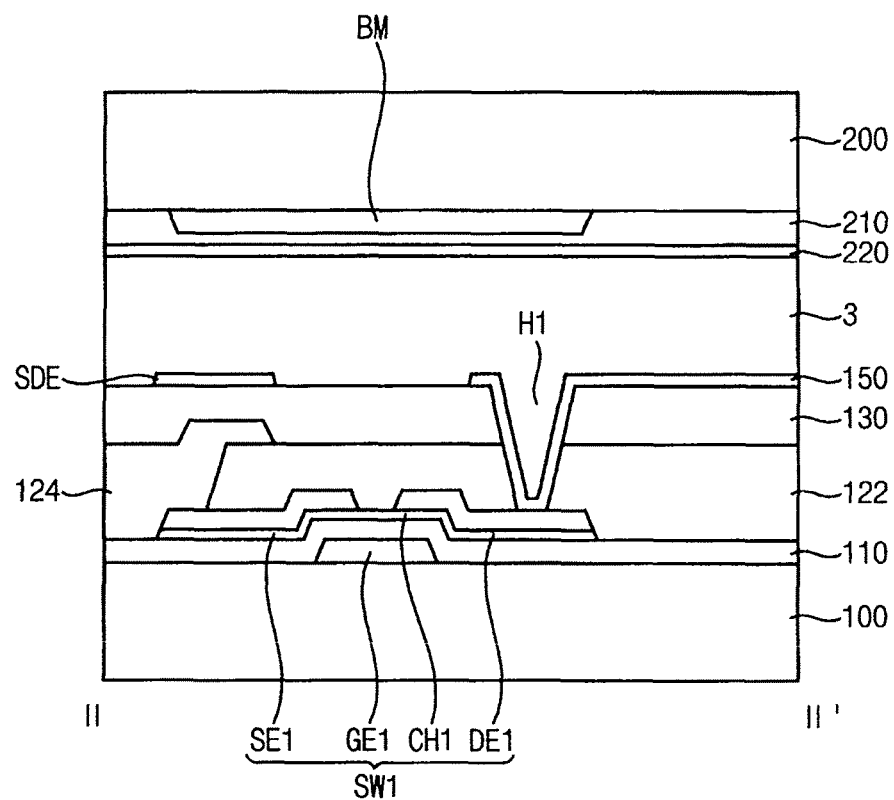
FIG. 3 is a cross-sectional view taken along a line II-IF of FIG. 1.

FIG. 2 is a cross-sectional view taken along a line I-I' of FIG. 1. FIG. 3 is a cross-sectional view taken along a line II-IF of FIG. 1. Although the figures illustrate a portion corresponding to a first switching element (e.g., refers to SW1 of FIG. 1), portions corresponding to second and third switching element (e.g., refers to SW2, SW3 of FIG. 1) may be substantially the same.

Referring to FIGS. 2 and 3, a display panel includes, for example, a first substrate, a second substrate facing the first substrate, and a liquid crystal layer 3 disposed between the first and second substrate.

The first substrate includes, for example, a first base substrate 100, a gate pattern, a first insulation layer 110, a channel layer CH, a data pattern, a first color filter 122, a second color filter 124, a third color filter 126, a second insulation layer 130, a first pixel electrode 150, a second pixel electrode 160, a third pixel electrode 170 and a shielding electrode SDE.

The first base substrate 100 may include, for example, a material which has relatively high transmittance, thermal resistance, and chemical resistance. For example, the first base substrate 100 may include any one selected from the group consisting of glass, quartz, or plastic. Further, in an embodiment, the first base substrate 100 may be, for example, a flexible substrate. Suitable materials for the flexible substrate include, for example, polyethylenenaphthalate, polyethylene terephthalate, polyacryl, polyimide, polyethersulfone, polyvinyl chloride, and a mixture thereof.

The gate pattern is disposed on the first base substrate 100. The gate pattern includes, for example, a gate line (e.g., refers to GL of FIG. 1), a first gate electrode GE1, a second gate electrode and a third gate electrode.

The first insulation layer 110 is disposed on the first base substrate 100 on which the gate pattern is disposed. The first insulation layer 110 covers and insulates the gate line, the first gate electrode GE1, the second gate electrode and the third gate electrode.

The channel layer CH is disposed on the first insulation layer 110. The channel layer CH includes, for example, a first channel portion CH1, a second channel portion and a third channel portion. The first channel portion CH1 overlaps, for example, the first gate electrode GE1. The second channel portion overlaps, for example, the second gate electrode. The third channel portion overlaps, for example, the third gate electrode.

The data pattern is disposed on the channel layer CH. The data pattern includes, for example, a first drain electrode DE1, a first source electrode SE1, a second drain electrode, a second source electrode, a third drain electrode, a third source electrode, a first data line DL1, a second data line DL2, and a third data line DL3.

The first gate electrode GE1, the first drain electrode DE1, the first source electrode SE1 and the first channel portion CH1 compose a first switching element SW1. The second gate electrode, the second drain electrode, the second source electrode and the second channel portion compose a second switching element (e.g., refers to SW2 of FIG. 1). The third gate electrode, the third drain electrode, the third source electrode and the third channel portion compose a third switching element (e.g., refers to SW3 of FIG. 1).

The first color filter 122 is disposed on the first insulation layer 110, and between the first data line DL1 and the second data line DL2. The first color filter 122 supplies colors to the light passing through the liquid crystal layer 3. The first color filter 122 may have a first color. For example, the first color filter 122 may be a red color filter which passes a red light. The first color filter 122 has a first thickness t1.

The second color filter 124 is disposed on the first insulation layer 110 on which the first color filter 122 is disposed, and between the second data line DL2 and a third data line DL3 of an adjacent pixel in a first direction (e.g., refers to D1 of FIG. 1). The second color filter 124 supplies colors to the light passing through the liquid crystal layer 3. The second color filter 124 may have a second color. For example, the second color filter 124 may be a green color filter which passes a green light. The second color filter 124 has a second thickness t2.

A boundary of the first color filter 122 and a boundary of the second color filter 124, for example, overlap each other on the second data line DL2. Thus, the first color filter 122 partially overlaps the second data line DL2. The second color filter 124 is disposed on the second data line DL2 and the first color filter 122, so that the second color filter 124, for example, partially overlaps the second data line DL2 and the first color filter 122.

The third color filter 126 is disposed on the first insulation layer 110 on which the first and second color filters 122 and 124 are disposed, and between the first data line DL1 and the third data line DL3. The third color filter 126 supplies colors to the light passing through the liquid crystal layer 3. The third color filter 126 may have a third color. For example, the third color filter 126 may be a blue color filter which passes a blue light. The third color filter 126 has a third thickness t3.

A boundary of the third color filter 126 and a boundary of the first color filter 122, for example, overlap each other on the first data line DL1. Thus, the first color filter 122, for example, partially overlaps the first data line DL1. The third color filter 126 is disposed on the first data line DL1 and the first color filter 122, so that the third color filter 126, for example, partially overlaps the first data line DL1 and the first color filter 122.

The first thickness t1, the second thickness t2, and the third thickness t3 may be same each other or different from each other according to a manufacturing process of the color filters. For example, the first thickness t1 may be smaller than the second and third thickness t2 and t3.

The second insulation layer 130 is disposed on the first to third color filters 122, 124 and 126. The second insulation layer 130 flattens, protects and insulates the first to third color filters 122, 124 and 126.

The first pixel electrode 150 is disposed on the second insulation layer 130, and is electrically connected to the first drain electrode DE1 of the first switching element SW1. The first pixel electrode 150 may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The first pixel electrode 150 includes, for example, first and second stems, and branches (refers to FIG. 4). The branches of the first pixel electrode 150 form a micro slit structure. The branch of the first pixel electrode 150 is spaced apart from an adjacent branch by a first space S1, and has a first width W1. Thus, the branches have, for example, a first pitch P1 (P1=W1+S1).

The second pixel electrode 160 is disposed on the second insulation layer 130, and is electrically connected to the second drain electrode of the second switching element SW2. The second pixel electrode 160 may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The second pixel electrode 160 includes, for example, first and second stems, and branches (e.g., refers to FIG. 5). The branches of the second pixel electrode 160 form, for example, a micro slit structure. The branch of the second pixel electrode 160 is spaced apart from an adjacent branch by a second space S2, and has a second width W2. Thus, the branches have, for example, a second pitch P2 (P2=W2+S2).

The third pixel electrode 170 is disposed on the second insulation layer 130, and is electrically connected to the third drain electrode of the third switching electrode. The third pixel electrode 170 may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The third pixel electrode 170 includes, for example, first and second stems, and branches (e.g., refers to FIG. 5). The branches of the third pixel electrode 170 form, for example, a micro slit structure. The branch of the third pixel electrode 170 is spaced apart from an adjacent branch by a third space S3, and has a third width W3. Thus, the branches have, for example, a third pitch P3 (P3=W3+S3).

The shielding electrode SDE is disposed on the second insulation layer 130. The shielding electrode SDE, for example, overlaps the first to third data lines DL1, DL2 and DL3. The shielding electrode SDE and the first to third pixel electrodes 150, 160 and 170 may be formed from, for example, the same material as each other. Thus, the shielding electrode SDE may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO).

The second substrate includes, for example, a second base substrate 200, a black matrix BM, an over-coating layer 210 and a common electrode 220.

The second base substrate 200 may include, for example, a material which has relatively high transmittance, thermal resistance, and chemical resistance. For example, the second base substrate 200 may include any one selected from the group consisting of glass, quartz, or plastic. Further, in an embodiment, the second base substrate 200 may be, for example, a flexible substrate. Suitable materials for the flexible substrate include, for example, polyethylenenaphthalate, polyethylene terephthalate, polyacryl, polyimide, polyethersulfone, polyvinyl chloride, and a mixture thereof.

The black matrix BM is disposed on, for example, the second base substrate 200. The black matrix BM includes a light blocking martial. The black matrix BM may be disposed, for example, in a peripheral area adjacent to a display area on which an image is disposed. Thus, the black matrix BM may, for example, overlap the first to third switching elements SW1, SW2 and SW3, the gate line GL, and the first to third data lines DL1, DL2 and DL3.

The over-coating layer 210 is disposed on the second base substrate 200 on which the black matrix BM is disposed. The over-coating layer 210 protects black matrix BM. The over-coating layer 210 may include, for example, an organic material. For example, in an embodiment, the over-coating layer 210 may include an acrylic-epoxy material The common electrode 220 is disposed on the over-coating layer 210. The common electrode 220 may include, for example, a transparent conductive material, such as indium tin oxide (ITO), indium zinc oxide (IZO) aluminum doped zinc oxide (AZO), cadmium zinc oxide (CZO), or amorphous indium tin oxide (a-ITO).

The liquid crystal layer 3 is disposed between the first substrate and the second substrate. The liquid crystal layer 3 includes liquid crystal molecules having optical anisotropy. The liquid crystal molecules are driven by an electric field, so that an image is displayed by passing or blocking light through the liquid crystal layer 3.

Figure 4:
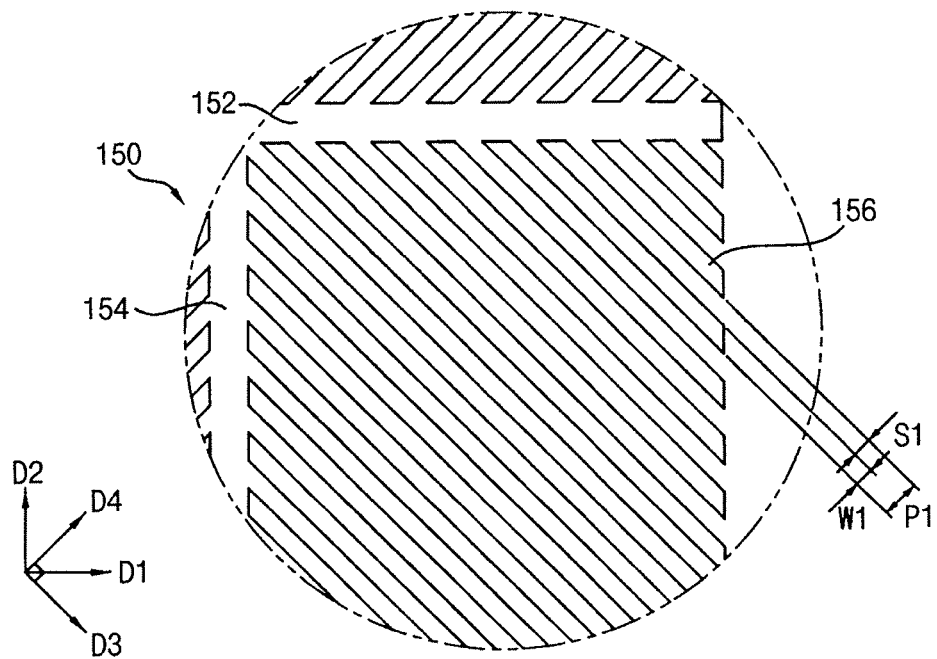
FIG. 4 is a partial enlarged view illustrating a first pixel electrode of the display panel of FIG. 1.

FIG. 4 is a partial enlarged view illustrating a first pixel electrode of the display panel of FIG. 1.

Referring to FIGS. 1 and 4, a first pixel electrode 150 includes, for example, a first stem 152, a second stem 154 and a plurality of branches 156 extending from the first stem 152 or the second stem 154.

The first stem 152 extends, for example, in a first direction D1. The second stem 154 extends, for example, in a second direction D2 which is substantially perpendicular to the first direction D1, and crosses the first stem 152. The first stem 152 and the second stem 154 may, for example, pass the center of the first pixel electrode 150, so that the first stem 152 and the second stem 154 divide the first pixel electrode 150 into four domains which have the same area as each other. Each of the domains has, for example, a plurality of branches 156 extending from the first stem 152 or the second stem 154. The branches 156 may, for example, be extended in different directions in each of the domains. The branches 156 form, for example, a micro slit structure.

Referring again to FIG. 4, the branches 156 extend, for example, in a third direction D3 from the first stem 152 or the second stem 154. The third direction D3 is, for example, different form the first and second directions D1 and D2. The branch 156 is spaced apart from an adjacent branch 156 by a first space S1. The branch 156 has a first width W1. Thus, the branches 156 have, for example, a first pitch P1 (P1=W1+S1). (e.g., refers to a fourth direction D4 perpendicular to the third direction D3.)

For example, ends of the branches 156 at a boundary of the first pixel electrode 150 are spaced apart each other, so that the ends of the branches 156 have an open structure.

Figure 5:
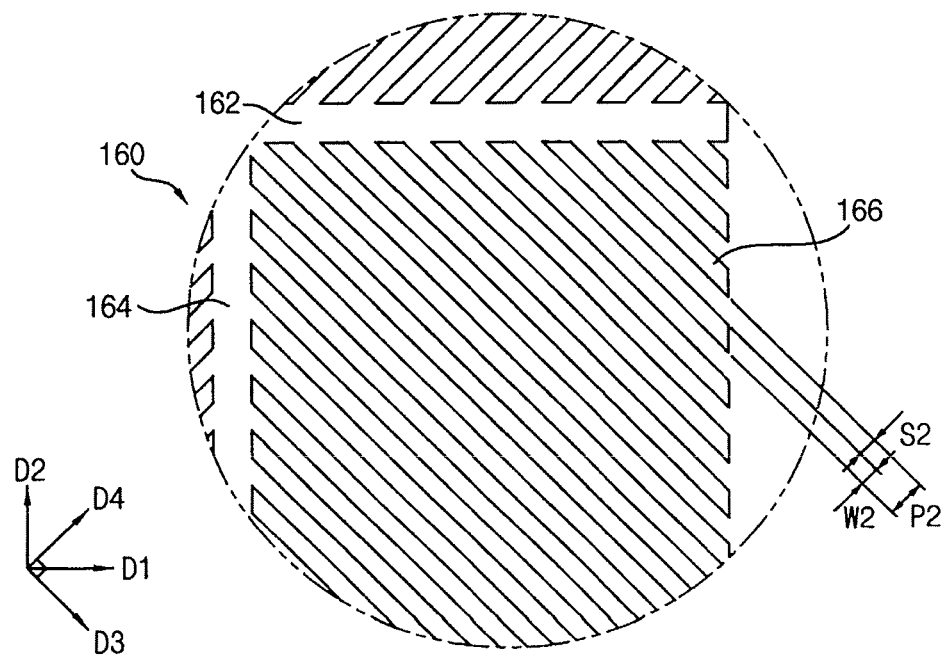
FIG. 5 is a partial enlarged view illustrating a second pixel electrode of the display panel of FIG. 1.

FIG. 5 is a partial enlarged view illustrating a second pixel electrode of the display panel of FIG. 1.

Referring to FIGS. 1 and 5, a second pixel electrode 160 includes, for example, a first stem 162, a second stem 164 and a plurality of branches 166 extending from the first stem 162 or the second stem 164.

The first stem 162 extends, for example, in a first direction D1. The second stem 164 extends, for example, in a second direction D2 which is substantially perpendicular to the first direction D1, and crosses the first stem 162. The first stem 162 and the second stem 164 may, for example, pass the center of the second pixel electrode 160, so that the first stem 162 and the second stem 164 divide the second pixel electrode 160 into four domains which have the same area as each other. Each of the domains has, for example, a plurality of branches 166 extending from the first stem 162 or the second stem 164. The branches 166 may be extended, for example, in different directions in each of the domains. The branches 166 form, for example, a micro slit structure.

Referring again to FIG. 5, the branches 166 extend, for example, in a third direction D3 from the first stem 162 or the second stem 164. The third direction D3 is, for example, different from the first and second directions D1 and D2. The branch 166 is spaced apart from an adjacent branch 166 by a second space S2. The branch 166 has a second width W2. Thus, the branches 266 have, for example, a second pitch P2 (P2=W2+S2). (e.g., refers to a fourth direction D4 perpendicular to the third direction D3.)

For example, ends of the branches 166 at a boundary of the second pixel electrode 160 are spaced apart each other, so that the ends of the branches 166 have an open structure.

The third pixel electrode 170 includes, for example, a first stem, a second stem, and a plurality of branches. The third pixel electrode 170 is, for example, substantially the same as the second pixel electrode 160. The branches of the third pixel electrode 170 have, for example, a third pitch (refers to P3 of FIG. 2), a third width (e.g., refers to W3 of FIG. 2) and a third space (e.g., refers to S3 of FIG. 2).

The first pitch P1 of the branches 156 of the first pixel electrode 150 may be, for example, the same as the second pitch P2 of the branches 166 of the second pixel electrode 160. In addition, the second pitch P2 of the branches 166 of the second pixel electrode 160 may be, for example, the same as the third pitch P3 of the branches the third pixel electrode 170.

For example, the first pitch P1, the second pitch P2 and the third pitch P3 may be about 6 μm (micrometer).

The first width W1 of the branches 156 of the first pixel electrode 150 may be, for example, smaller than the second width W2 of the branches 166 of the second pixel electrode 160. In addition, the first width W1 of the branches 156 of the first pixel electrode 150 may be smaller than third width W3 of the branches of the third pixel electrode 170.

For example, the first width W1 may be about 3.4 μm (micrometer), and the second and third widths W2 and W3 may be about 3.5 μm (micrometer).

The first space S1 of the branches 156 of the first pixel electrode 150 may be, for example, larger than the second space S2 of the branches 166 of the second pixel electrode 160. In addition, the first space S1 of the branches 156 of the first pixel electrode 150 may be, for example, larger than third space S3 of the branches of the third pixel electrode 170.

For example, the first space S1 may be about 2.6 um (micrometer), and the second and third spaces S2 and S3 may be about 2.5 μm (micrometer).

Accordingly, the first width W1 of the branches 156 of the first pixel electrode 150 may be, for example, smaller than the second width W2 of the branches 166 of the second pixel electrode 160 and/or the third width W3 of the branches of the third pixel electrode 170. Thus, a texture only formed in the first pixel electrode 150 may be controlled with minimizing decrease of transmittance. The second width W2 of the second pixel electrode 160 and the third width W3 of the third pixel electrode 170 are, for example, larger than the first width W1 of the first pixel electrode 150, so that transmittance of the second and third pixel electrodes 160 and 170 may not be decreased.

Figure 6:
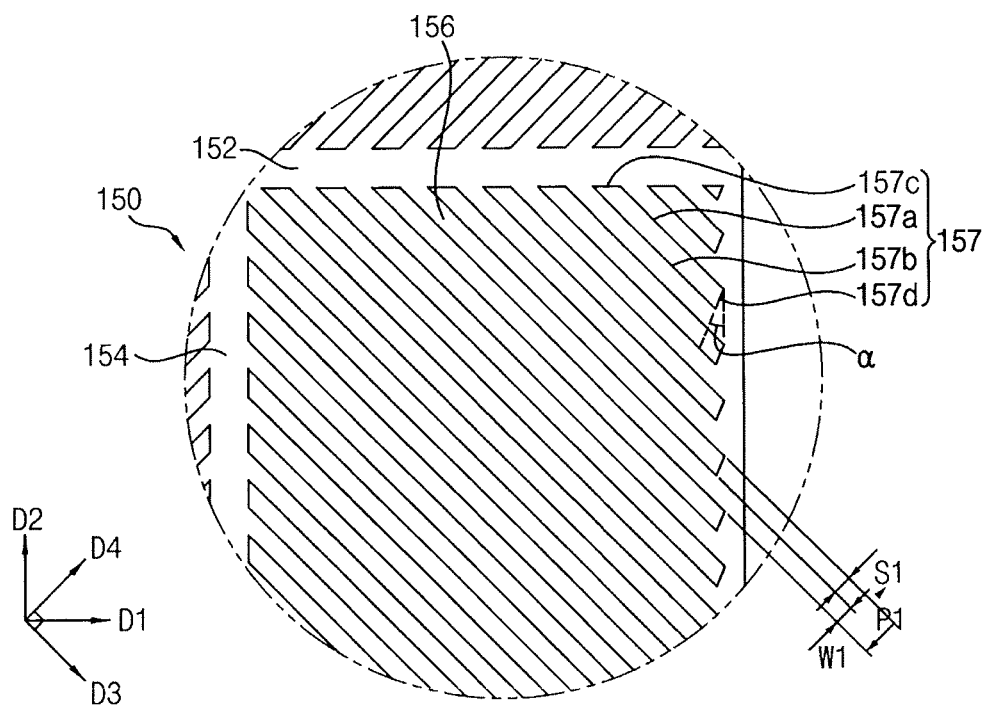
FIG. 6 is a partial enlarged view illustrating a first pixel electrode of a display panel according to an exemplary embodiment of the invention.

FIG. 6 is a partial enlarged view illustrating a first pixel electrode of a display panel according to an exemplary embodiment of the invention.

Referring to FIGS. 1 and 6, a first pixel electrode 150 includes, for example, a first stem 152, a second stem 154 and a plurality of branches 156 extending from the first stem 152 or the second stem 154.

The first stem 152 extends, for example, in a first direction D1. The second stem 154 extends, for example, in a second direction D2 which is substantially perpendicular to the first direction D1, and crosses the first stem 152. The first stem 152 and the second stem 154 may, for example, pass the center of the first pixel electrode 150, so that the first stem 152 and the second stem 154 divide the first pixel electrode 150 into four domains which have the same area as each other. Each of the domains has, for example, a plurality of branches extending from the first stem 152 or the second stem 154. The branches 156 may be extended, for example, in different directions in each of the domains. The branches 156 form, for example, a micro slit structure.

Referring again to FIG. 6, the branches 156 extend, for example, in a third direction D3 from the first stem 152 or the second stem 154. The third direction D3 is, for example, different form the first and second directions D1 and D2. The branch 156 is spaced apart from an adjacent branch 156 by a first space S1. The branch 156 has a first width W1. Thus, the branches have, for example, a first pitch P1 (P1=W1+ S1). (e.g., refers to a fourth direction D4 perpendicular to the third direction D3.)

For example, ends of the branches 156 at a boundary of the first pixel electrode 150 are connected to each other, so that the ends of the branches 156 form a closed structure. Thus, the branches 156 form a plurality of openings 157. The openings 157 include, for example, a first and second sides 157a and 157b contacting with adjacent branches 156, a third side 157c adjacent to the first or second stems 152 and 154, and a fourth side 157d adjacent to a boundary of the first pixel electrode 150. The fourth side 157d forms, for example, a first angle α with a line extending along the boundary of the first pixel electrode 150.

Thus, a slope is formed at the boundary of the openings of the first pixel electrode 150, and a texture formed at the boundary of the first pixel electrode 150 may be decreased.

The second pixel electrode (e.g., refers to 160 of FIG. 1) is, for example, substantially the same as the first pixel electrode 150, except that branches 166 have a second pitch (e.g., refers to P2 of FIG. 2), a second width (e.g., refers to W2 of FIG. 2), and a second space (e.g., refers to S2 of FIG. 2). Thus, any further detailed descriptions concerning the same elements will be omitted.

The third pixel electrode (e.g., refers to 170 of FIG. 1) is, for example, substantially the same as the first pixel electrode 150, except that branches of the third pixel electrode have a third pitch (e.g., refers to P3 of FIG. 2), a third width (e.g., refers to W3 of FIG. 2), and a third space (e.g., refers to S3 of FIG. 2). Thus, any further detailed descriptions concerning the same elements will be omitted.

The first pitch P1 of the branches 156 of the first pixel electrode 150 may be, for example, substantially the same as the second pitch P2 of the second pixel electrode 160. In addition, the second pitch P2 of the branches 166 of the second pixel electrode 160 may be, for example, substantially the same as the third pitch P3 of the branches of the third pixel electrode 170.

The first width W1 of the branches 156 of the first pixel electrode 150 may be, for example, smaller than the second width W2 of the branches 166 of the second pixel electrode 160. In addition, the first width W1 of the branches 156 of the first pixel electrode 150 may be, for example, smaller than the third width W3 of the branches of the third pixel electrode 170.

The first space S1 of the branches 156 of the first pixel electrode 150 may be, for example, larger than the second space S2 of the branches 166 of the second pixel electrode 160. In addition, the first space S1 of the branches 156 of the first pixel electrode 150 may be, for example, larger than the third space S3 of the branches of the third pixel electrode 170.

Figure 7:
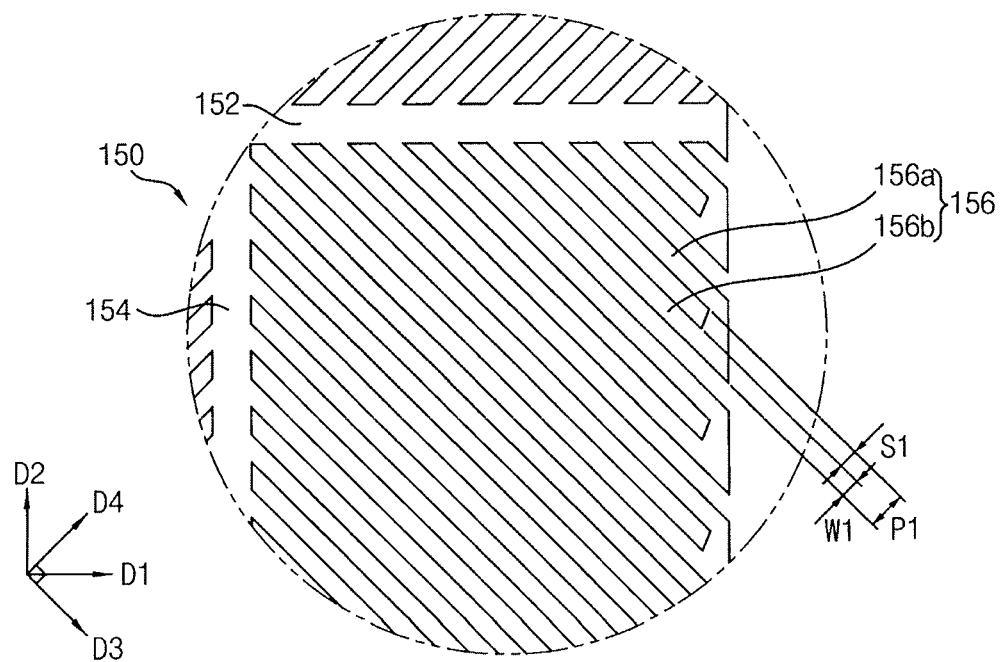
FIG. 7 is a partial enlarged view illustrating a first pixel electrode of a display panel according to an exemplary embodiment of the invention.

FIG. 7 is a partial enlarged view illustrating a first pixel electrode of a display panel according to an exemplary embodiment of the invention.

Referring to FIG. 7, the first pixel electrode 150 is, for example, substantially the same as a first pixels electrode of FIG. 6, except for the first and second sub-branches 156a and 156b. Thus, any further detailed descriptions concerning the same elements will be briefly described or omitted.

The first pixel electrode 150 includes, for example, a first stem 152, a second stem 154, and a plurality of branches 156 extending from the first stem 152 or the second stem 154.

The first stem 152 extends, for example, in a first direction D1. The second stem 154 extends, for example, in a second direction D2 which is substantially perpendicular to the first direction D1, and crosses the first stem 152. The first stem 152 and the second stem 154 may, for example, pass the center of the first pixel electrode 150, so that the first stem 152 and the second stem 154 divide the first pixel electrode 150 into four domains which have the same area as each other. Each of the domains has, for example, a plurality of branches 156 extending from the first stem 152 or the second stem 154. The branches 156 may be extended, for example, in different directions in each of the domains. The branches form, for example, a micro slit structure.

Referring again to FIG. 7, the branches 156 extend, for example, in a third direction D3 from the first stem 152 or the second stem 154. The third direction D3 is, for example, different from the first and second directions D1 and D2.

Each of the branches 156 includes, for example, a first sub-branch 156a and a second sub-branch 156b. The first sub-branch 156a extends, for example, in the third direction D3 from the first stem 152 or the second stem 154. The second sub-branch 156b extends, for example, in the third direction D3 from the first stem 152 or the second stem 154. The first sub-branch 156a and the second sub-branch 156b are connected to each other at a boundary of the first pixel electrode 150. Thus, an opening is formed between the first sub-branch 156a and the second sub-branch 156b. A side of the opening which is adjacent to the boundary of the first pixel electrode 150 makes, for example, a first angle (e.g., refers α of FIG. 6) with a line extending along the boundary.

Each of the first and second sub-branches 156a and 156b are spaced apart from adjacent first or second sub-branches 156a and 156b by a first space S1. The first and second sub-branches 156a and 156b have a first width W1. Thus, the first and second sub-branches 156a and 156b have, for example, a first pitch P1 (P1=W1+S1). (e.g., refers to a fourth direction D4 perpendicular to the third direction D3.)

The second pixel electrode (e.g., refers to 160 of FIG. 1) is, for example, substantially the same as the first pixel electrode 150, except that the first and second sub-branches 156a and 156b have a second pitch, a second width, and a second space. Thus, any further detailed descriptions concerning the same elements will be omitted.

The third pixel electrode (e.g., refers to 170 of FIG. 1) is, for example, substantially the same as the first pixel electrode 150, except that the first and second sub-branches 156a and 156b have a third pitch, a third width, and a third space. Thus, any further detailed descriptions concerning the same elements will be omitted.

The first pitch P1 of the first and second sub-branches 156a and 156b of the first pixel electrode 150 may be, for example, substantially the same as the second pitch of the first and second sub-branches of the second pixel electrode 160. In addition, the second pitch of the first and second sub-branches of the second pixel electrode 160 may be, for example, substantially the same as the third pitch of the first and second sub-branches of the third pixel electrode 170.

The first width W1 of the first and second sub-branches 156a and 156b of the first pixel electrode 150 may be, for example, substantially the same as the second width of the first and second sub-branches of the second pixel electrode 160. In addition, the first width W1 of the first and second sub-branches 156a and 156b of the first pixel electrode 150 may be, for example, smaller than the third width of the first and second sub-branches of the third pixel electrode 170.

The first space S1 of the first and second sub-branches 156a and 156b of the first pixel electrode 150 may be, for example, larger than the second space of the first and second sub-branches of the second pixel electrode 160. In addition, the first space S1 of the first and second sub-branches 156a and 156b of the first pixel electrode 150 may be, for example, larger than the third space of the first and second sub-branches of the third pixel electrode 170.

Figure 8:
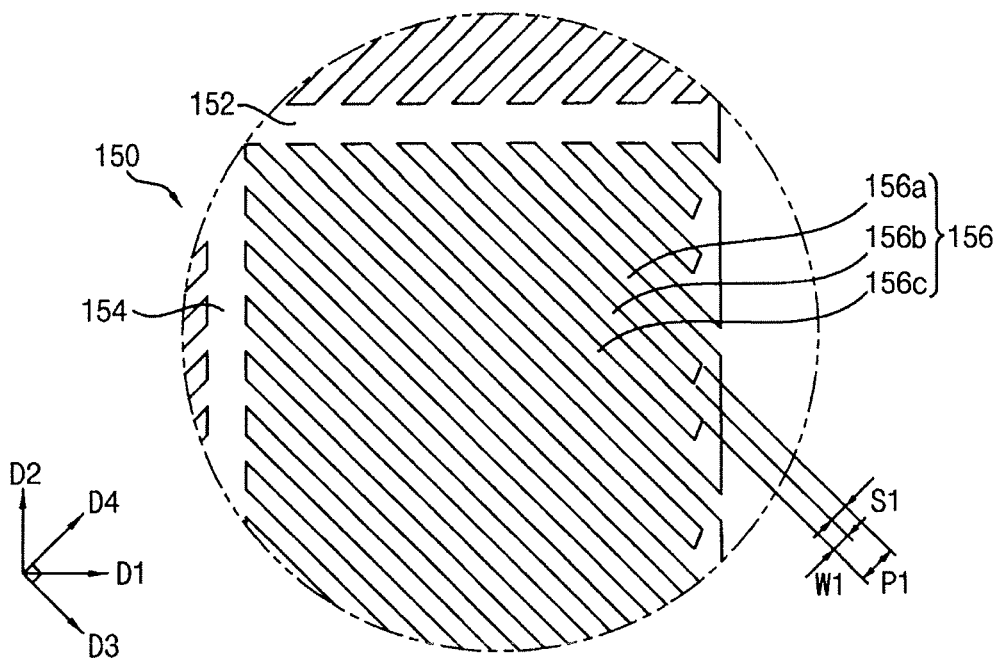
FIG. 8 is a partial enlarged view illustrating a first pixel electrode of a display panel according to an exemplary embodiment of the invention.

FIG. 8 is a partial enlarged view illustrating a first pixel electrode of a display panel according to an exemplary embodiment of the invention.

Referring to FIG. 8, the first pixel electrode 150 is, for example, substantially the same as the first pixel electrode of FIG. 7, except that a branch 156 includes first to third sub-branches 156a to 156c. Thus, any further detailed descriptions concerning the same elements will be omitted.

The first pixel electrode 150 includes, for example, a first stem 152, a second stem 154, and a plurality of branches 156 extending from the first stem 152 or the second stem 154.

The first stem 152 extends, for example, in a first direction D1. The second stem 154 extends, for example, in a second direction D2 which is substantially perpendicular to the first direction D1, and crosses the first stem 152. The first stem 152 and the second stem 154 may, for example, pass the center of the first pixel electrode 150, so that the first stem 152 and the second stem 154 divide the first pixel electrode 150 into four domains which have the same area. Each of the domains has, for example, a plurality of branches 156 extending from the first stem 152 or the second stem 154. The branches 156 may be extended, for example, in different directions in each of the domains. The branches 156 form, for example, a micro slit structure.

Referring again to FIG. 8, the branches 156 extend, for example, in a third direction D3 from the first stem 152 or the second stem 154. The third direction D3 is, for example, different from the first and second directions D1 and D2.

Each of the branches 156 includes, for example, a first sub-branch 156a, a second sub-branch 156b and a third sub-branch 156c. The first sub-branch 156a extends, for example, in the third direction D3 from the first stem 152 or the second stem 154. The second sub-branch 156b extends, for example, in the third direction D3 from the first stem 152 or the second stem 154. The third sub-branch 156c extends, for example, in the third direction D3 from the first stem 152 or the second stem 154. The first sub-branch 156a, the second sub-branch 156b and the third sub-branch 156c are connected to each other at a boundary of the first pixel electrode 150. Thus, an opening is formed between the first sub-branch 156a and the second sub-branch 156b. In addition, another opening is formed between the second sub-branch 156b and the third sub-branch 156c. A side of each of the openings which is adjacent to the boundary of the first pixel electrode 150 makes, for example, a first angle (e.g., refers α of FIG. 6) with a line extending along the boundary.

Each of the first to third sub-branches 156a, 156b and 156c is spaced apart from adjacent first, second or third second sub-branch 156a, 156b or 156c by a first space S1. The first to third sub-branches 156a, 156b and 156c have a first width W1. Thus, the first to third sub-branches 156a, 156b and 156c have, for example, a first pitch P1 (P1=W1+S1). (e.g., refers to a fourth direction D4 perpendicular to the third direction D3.)

The second pixel electrode (e.g., refers to 160 of FIG. 1) is, for example, substantially the same as the first pixel electrode 150, except that the first to third sub-branches 156a, 156b and 156c have a second pitch, a second width, and a second space. Thus, any further detailed descriptions concerning the same elements will be omitted.

The third pixel electrode (e.g., refers to 170 of FIG. 1) is, for example, substantially the same as the first pixel electrode 150, except that the first to third sub-branches 156a, 156b and 156c have a third pitch, a third width, and a third space. Thus, any further detailed descriptions concerning the same elements will be omitted.

The first pitch P1 of the first to third sub-branches 156a, 156b and 156c of the first pixel electrode 150 may be, for example, substantially the same as the second pitch of the first to third sub-branches of the second pixel electrode 160. In addition, the second pitch of the first to third sub-branches of the second pixel electrode 160 may be, for example, substantially the same as the third pitch of the first to third sub-branches of the third pixel electrode 170.

The first width W1 of the first to third sub-branches 156a, 156b and 156c of the first pixel electrode 150 may be, for example, substantially the same as the second width of the first to third sub-branches of the second pixel electrode 160. In addition, the first width W1 of the first to third sub-branches 156a, 156b and 156c of the first pixel electrode 150 may be, for example, smaller than the third width of the first to third sub-branches of the third pixel electrode 170.

The first space S1 of the first to third sub-branches 156a, 156b and 156c of the first pixel electrode 150 may be, for example, larger than the second space of the first to third sub-branches of the second pixel electrode 160. In addition, the first space S1 of the first to third sub-branches 156a, 156b and 156c of the first pixel electrode 150 may be, for example, larger than the third space of the first to third sub-branches of the third pixel electrode 170.

Figure 9:
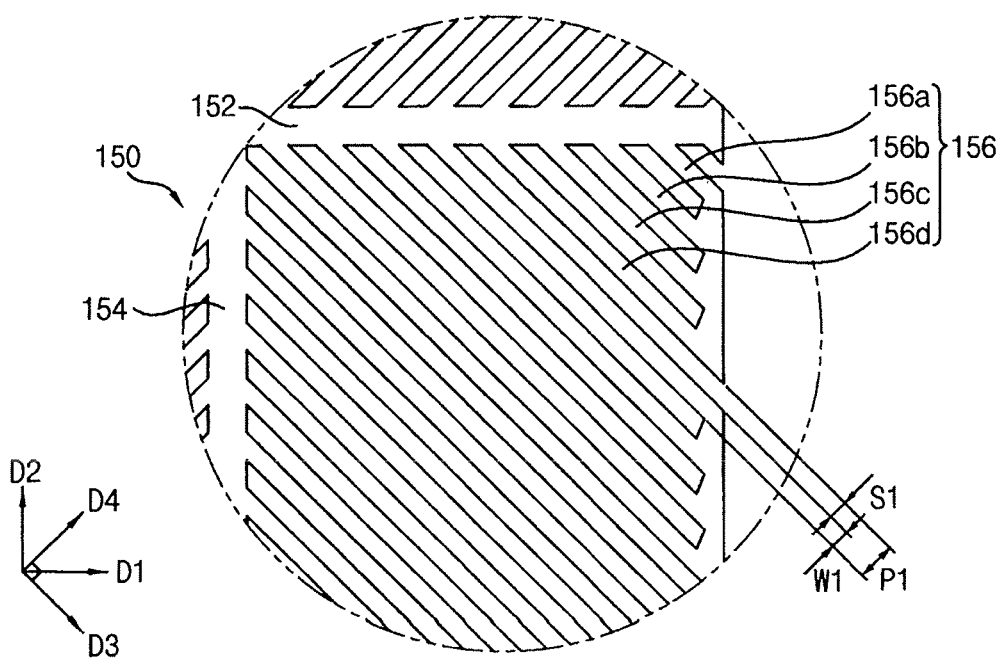
FIG. 9 is a partial enlarged view illustrating a first pixel electrode of a display panel according to an exemplary embodiment of the invention.

FIG. 9 is a partial enlarged view illustrating a first pixel electrode of a display panel according to an exemplary embodiment of the invention.

Referring to FIG. 9, the first pixel electrode 150 is, for example, substantially the same as the first pixel electrode of FIG. 7, except that a branch 156 includes first to fourth sub-branches 156a, 156b, 156c and 156d. Thus, any further detailed descriptions concerning the same elements will be omitted.

The first pixel electrode 150 includes, for example, a first stem 152, a second stem 154, and a plurality of branches 156 extending from the first stem 152 or the second stem 154.

The first stem 152 extends, for example, in a first direction D1. The second stem 154 extends, for example, in a second direction D2 which is substantially perpendicular to the first direction D1, and crosses the first stem 152. The first stem 152 and the second stem 154 may, for example, pass the center of the first pixel electrode 150, so that the first stem 152 and the second stem 154 divide the first pixel electrode 150 into four domains which have the same area as each other. Each of the domains has, for example, a plurality of branches 156 extending from the first stem 152 or the second stem 154. The branches 156 may be extended, for example, in different directions in each of the domains. The branches 156 form, for example, a micro slit structure.

Referring again to FIG. 9, the branches 156 extend, for example, in a third direction D3 from the first stem 152 or the second stem 154. The third direction D3 is, for example, different form the first and second directions D1 and D2.

Each of the branches 156 includes, for example, a first sub-branch 156a, a second sub-branch 156b, a third sub-branch 156c and a fourth sub-branch 156d. The first sub-branch 156a extends, for example, in the third direction D3 from the first stem 152 or the second stem 154. The second sub-branch 156b extends, for example, in the third direction D3 from the first stem 152 or the second stem 154. The third sub-branch 156c extends, for example, in the third direction D3 from the first stem 152 or the second stem 154. The fourth sub-branch 156d extends in the third direction D3 from the first stem 152 or the second stem 154. The first sub-branch 156a, the second sub-branch 156b, the third sub-branch 156c and the fourth sub-branch 156d are connected to each other at a boundary of the first pixel electrode 150. Thus, an opening is formed between the first sub-branch 156a and the second sub-branch 156b. In addition, another opening is formed between the second sub-branch 156b and the third sub-branch 156c. In addition, still another opening is formed between the third sub-branch 156c and the fourth sub-branch 156d. A side of each of the openings which is adjacent to the boundary of the first pixel electrode 150 makes, for example, a first angle (e.g., refers α of FIG. 6) with a line extending along the boundary.

Each of the first to fourth sub-branches 156a, 156b, 156c and 156d is spaced apart from adjacent first, second, third or fourth second sub-branch 156a, 156b, 156c, 156d by a first space S1. The first to fourth sub-branches 156a. 156b, 156c and 156d have a first width W1. Thus, the first to fourth sub-branches 156a, 156b, 156c and 156d have, for example, a first pitch P1 (P1=W1+S1). (e.g., refers to a fourth direction D4 perpendicular to the third direction D3.)

The second pixel electrode (e.g., refers to 160 of FIG. 1) is, for example, substantially the same as the first pixel electrode 150, except that the first to fourth sub-branches 156a, 156b, 156c and 156d have a second pitch, a second width, and a second space. Thus, any further detailed descriptions concerning the same elements will be omitted.

The third pixel electrode (e.g., refers to 170 of FIG. 1) is, for example, substantially the same as the first pixel electrode 150, except that the first to fourth sub-branches 156a, 156b, 156c and 156d have a third pitch, a third width, and a third space. Thus, any further detailed descriptions concerning the same elements will be omitted.

The first pitch P1 of the first to fourth sub-branches 156a, 156b, 156c and 156d of the first pixel electrode 150 may be, for example, substantially the same as the second pitch of the first to fourth sub-branches of the second pixel electrode 160. In addition, the second pitch of the first to fourth sub-branches of the second pixel electrode 160 may be, for example, substantially the same as the third pitch of the first to fourth sub-branches of the third pixel electrode 170.

The first width W1 of the first to fourth sub-branches 156a, 156b, 156c and 156d of the first pixel electrode 150 may be, for example, substantially the same as the second width of the first to fourth sub-branches of the second pixel electrode 160. In addition, the first width W1 of the first to fourth sub-branches 156a, 156b, 156c and 156d of the first pixel electrode 150 may be, for example, smaller than the third width of the first to fourth sub-branches of the third pixel electrode 170.

The first space S1 of the first to fourth sub-branches 156a, 156b, 156c and 156d of the first pixel electrode 150 may be, for example, larger than the second space of the first to fourth sub-branches of the second pixel electrode 160. In addition, the first space S1 of the first to fourth sub-branches 156a, 156b, 156c and 156d of the first pixel electrode 150 may be, for example, larger than the third space of the first to fourth sub-branches of the third pixel electrode 170.

Figure 10:
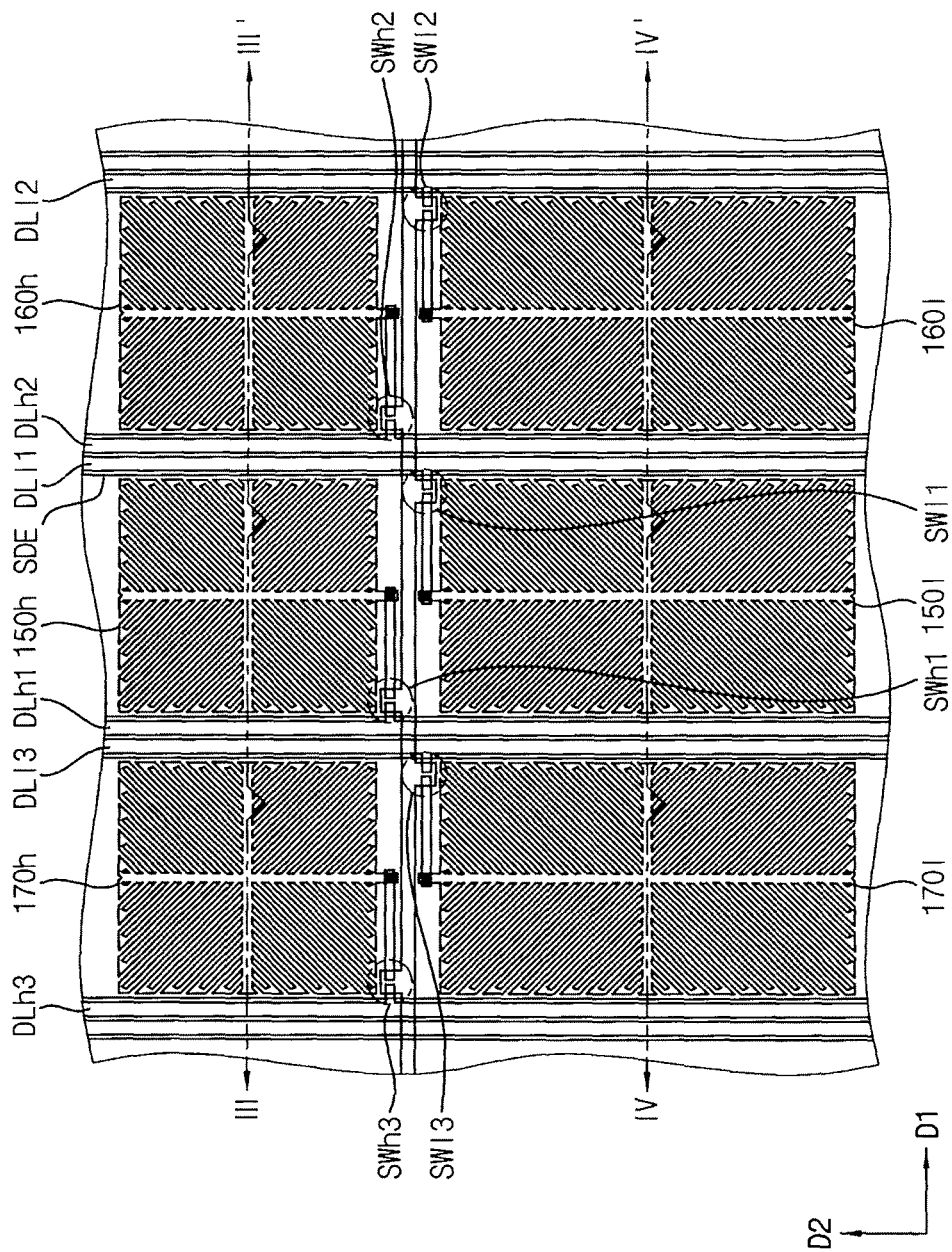
FIG. 10 is a plan view illustrating a display panel according to an exemplary embodiment of the invention.

FIG. 10 is a plan view illustrating a display panel according to an exemplary embodiment of the invention.

Referring to FIG. 10, a display panel includes, for example, a gate line GL, a first high data line DLh1, a first low data line DLl1, a second high data line DLh2, a second low data line DLl2, a third high data line DLh3, a third low data line DLl3, a first high switching element SWh1, a first low switching element SWl1, a second high switching element SWh2, a second low switching element SWl2, a third high switching element SWh3, a third low switching element SWl3, a first high pixel electrode 150h, a first low pixel electrode 150l, a second high pixel electrode 160h, a second low pixel electrode 160l, a third high pixel electrode 170h, a third low pixel electrode 170l and a shielding electrode SDE.

The gate line GL extends, for example, in a first direction D1. The gate line GL is electrically connected to the first high switching element SWh1, the first low switching element SWl1, the second high switching element SWh2, the second low switching element SWl2, the third high switching element SWh3 and the third low switching element SWl3. A gate signal is applied to the gate line GL.

The first high data line DLh1 extends, for example, in a second direction D2 which is substantially perpendicular to the first direction D1. The first high data line DLh1 crosses the gate line GL. The first high data line DLh1 is electrically connected to the first high switching element SWh1.

The first low data line DLl1 extends, for example, in the second direction D2, and is spaced apart from the first high data line DLh1. The first low data line DLl1 crosses the gate line GL. The first low data line DLl1 is electrically connected to the first low switching element SWl1.

The second high data line DLh2 is adjacent to the first low data line DLl1, and extends, for example, in the second direction D2. The second high data line DLh2 crosses the gate line GL. The second high data line DLh2 is electrically connected to the second high switching element SWh2.

The second low data line DLl2 extends, for example, in the second direction D2, and is spaced apart from the second high data line DLh2. The second low data line DLl2 crosses the gate line GL. The second low data line DLl2 is electrically connected to the second low switching element SWl2.

The third high data line DLh3 extends, for example, in the second direction D2, and is spaced apart from the first high data line DLh1. The third high data line DLh3 crosses the gate line GL. The third high data line DLh3 is, for example, disposed opposite to the second high data line DLh2 with reference to the first high data line DLh1.

The third low data line DLl3 is adjacent to the first high data line DLh1, and extends, for example, in the second direction D2. The third low data line DLl3 crosses the gate line GL. The third low data line DLl3 is electrically connected to the third low switching element SWl3.

The first high pixel electrode 150h is disposed adjacent to the gate line GL, and between the first high data line DLh1 and the first low data line DLl1. The first high pixel electrode 150h is electrically connected to the first high switching element SWh1. The first high pixel electrode 150h includes, for example, a plurality of branches forming a micro-slit pattern.

The first low pixel electrode 150l is disposed opposite to the first high pixel electrode 150h with reference to the gate line GL, and between the first high data line DLh1 and the first low data line DLl1. The first low pixel electrode 150l is electrically connected to the first low switching element SWl1. The first low pixel electrode 150l includes, for example, a plurality of branches forming a micro-slit pattern.

The second high pixel electrode 160h is disposed adjacent to the gate line GL, and between the second high data line DLh2 and the second low data line DLl2. The second high pixel electrode 160h is electrically connected to the second high switching element SWh2. The second high pixel electrode 160h includes, for example, a plurality of branches forming a micro-slit pattern.

The second low pixel electrode 160l is disposed opposite to the second high pixel electrode 160h with reference to the gate line GL, and between the second high data line DLh2 and the second low data line DLl2. The second low pixel electrode 160l is electrically connected to the second low switching element SWl2. The second low pixel electrode 160l includes, for example, a plurality of branches forming a micro-slit pattern.

The third high pixel electrode 170h is disposed adjacent to the gate line GL, and between the third high data line DLh3 and the third low data line DLl3. The third high pixel electrode 170h is electrically connected to the third high switching element SWh3. The third high pixel electrode 170h includes, for example, a plurality of branches forming a micro-slit pattern.

The third low pixel electrode 170l is disposed opposite to the third high pixel electrode 170h with reference to the gate line GL, and between the third high data line DLh3 and the third low data line DLl3. The third low pixel electrode 170l is electrically connected to the third low switching element SWl3. The third low pixel electrode 170l includes, for example, a plurality of branches forming a micro-slit pattern.

The shielding electrode SDE extends, for example, in the second direction D2, and overlaps the first to third high data lines and the first to third low data lines DLh1 DLl1, DLh2, DLl2, DLh3 and DLl3. A shielding voltage is applied to the shielding electrode SDE. For example, a common voltage which is applied to a common electrode (e.g., refers to 220 of FIG. 11) may be applied to the shielding electrode SDE.

Figure 11:
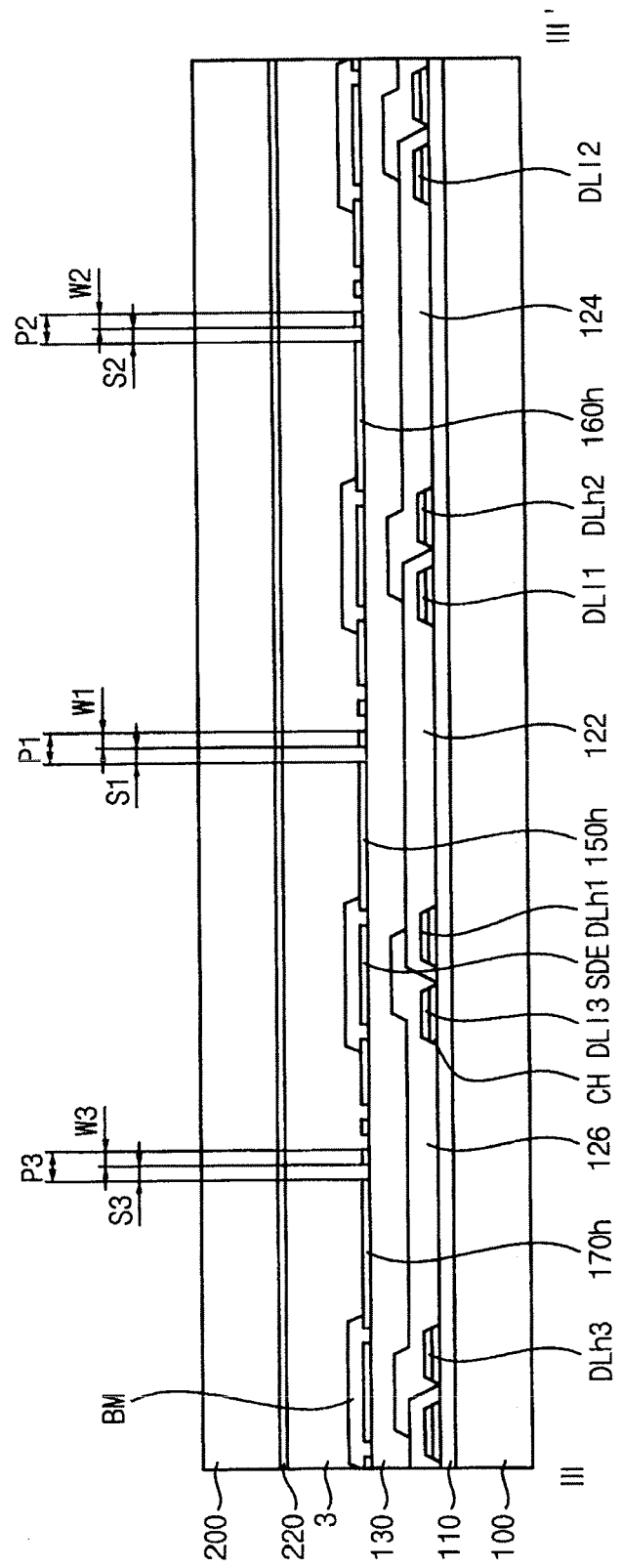
FIG. 11 is a cross-sectional view taken along a line of FIG. 10.
Figure 12:
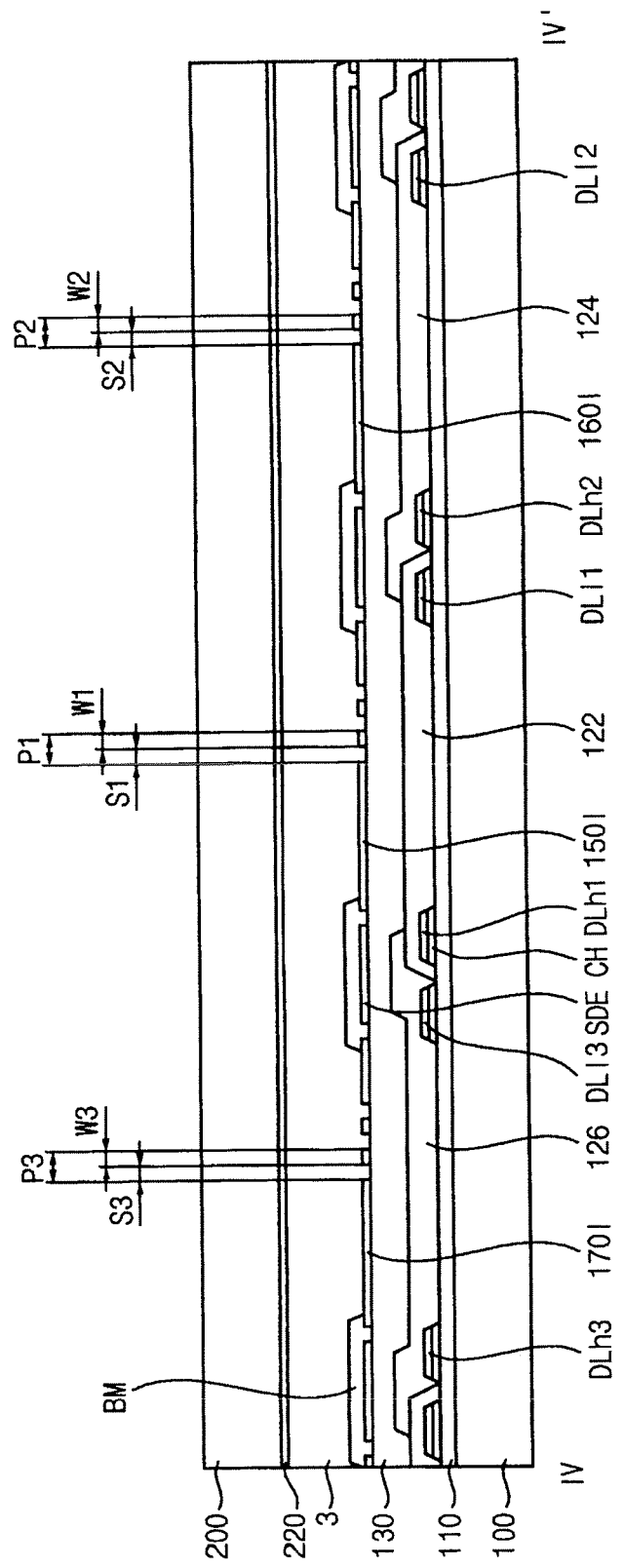
FIG. 12 is a cross-sectional view taken along a line IV-IV' of FIG. 10.

FIG. 11 is a cross-sectional view taken along a line III-III' of FIG. 10. FIG. 12 is a cross-sectional view taken along a line IV-IV' of FIG. 10.

Referring to FIGS. 11 and 12, a display panel includes, for example, a first substrate, a second substrate facing the first substrate, and a liquid crystal layer 3 disposed between the first and second substrate.

The first substrate includes, for example, a first base substrate 100, a gate pattern, a first insulation layer 110, a channel layer, a data pattern, a first color filter 122, a second color filter 124, a third color filter 126, a second insulation layer 130, a first high pixel electrode 150h, a first low pixel electrode 150l, a second high pixel electrode 160h, a second low pixel electrode 160l, a third high pixel electrode 170h, a third low pixel electrode 170l, a shielding electrode SDE and a black matrix BM.

The first base substrate 100 may include, for example, a material which has relatively high transmittance, thermal resistance, and chemical resistance. For example, the first base substrate 100 may include any one selected from the group consisting of glass, quartz, or plastic. Further, in an embodiment, the first base substrate 100 may be, for example, a flexible substrate. Suitable materials for the flexible substrate include, for example, polyethylenenaphthalate, polyethylene terephthalate, polyacryl, polyimide, polyethersulfone, polyvinyl chloride, and a mixture thereof.

The gate pattern is disposed on the first base substrate 100. The gate pattern includes, for example, a gate line (e.g., refers to GL of FIG. 1), a first gate electrode, a second gate electrode and a third gate electrode.

The first insulation layer 110 is disposed on the first base substrate 100 on which the gate pattern is disposed. The first insulation layer 110 covers and insulates the gate line, the first gate electrode GE1, the second gate electrode and the third gate electrode.

The channel layer is disposed on the first insulation layer 110. The channel layer includes, for example, a first channel portion, a second channel portion and a third channel portion. The first channel portion, for example, overlaps the first gate electrode. The second channel portion, for example, overlaps the second gate electrode. The third channel portion, for example, overlaps the third gate electrode.

The data pattern is disposed on the channel layer. The data pattern includes, for example, a first drain electrode, a first source electrode, a second drain electrode, a second source electrode, a third drain electrode, a third source electrode, a first high data line DLh1, a first low data line DLl1, a second high data line DLh2, a second low data line DLl2, a third high data line DLh3 and a third low data line DLl3.

The first gate electrode, the first drain electrode, the first source electrode and the first channel portion compose a first switching element (e.g., refers to SW1 of FIG. 10). The second gate electrode, the second drain electrode, the second source electrode and the second channel portion compose a second switching element (e.g., refers to SW2 of FIG. 10). The third gate electrode, the third drain electrode, the third source electrode and the third channel portion compose a third switching element (e.g., refers to SW3 of FIG. 10).

The first color filter 122 is disposed on the first insulation layer 110, and between the third low data line DLl1 and the second high data line DLh2. The first color filter 122 supplies colors to the light passing through the liquid crystal layer 3. The first color filter 122 may have a first color. For example, the first color filter 122 may be a red color filter which passes a red light. The first color filter 122 has a first thickness.

The second color filter 124 is disposed on the first insulation layer 110 on which the first color filter 122 is disposed, and between the first low data line DLl1 and a third high data line of an adjacent pixel in a first direction (e.g., refers to D1 of FIG. 10). The second color filter 124 supplies colors to the light passing through the liquid crystal layer 3. The second color filter 124 may have a second color. For example, the second color filter 124 may be a green color filter which passes a green light. The second color filter 124 has a second thickness.

A boundary of the first color filter 122 and a boundary of the second color filter 124, for example, overlap each other between on the first low data line DLl1 and the second high data line DLh2. Thus, the first color filter 122 covers the first low data line DLl1. The second color filter 124 disposed on the first low data line DLl1, so that the second color filter 124, for example, partially overlaps the first color filter 122.

The third color filter 126 is disposed on the first insulation layer 110 on which the first and second color filters 122 and 124 are disposed, and between the first high data line DLh1 and a second low data line DLl2 of an adjacent pixel in the first direction. The third color filter 126 supplies colors to the light passing through the liquid crystal layer 3. The third color filter 126 may have a third color. For example, the third color filter 126 may be a blue color filter which passes a blue light. The third color filter 126 has a third thickness.

A boundary of the third color filter 126 and a boundary of the first color filter 122, for example, overlap each other between on the third low data line DLl3 and the first high data line DLh1. Thus, the first color filter 122 covers the first high data line DLh1. The third color filter 126 is disposed on the first high data line DLh1, so that the third color filter 126, for example, partially overlaps the first color filter 122.

The first thickness, the second thickness, and the third thickness may be same each other or different from each other according to a manufacturing process of the color filters. For example, the first thickness may be smaller than the second and third thickness.

The second insulation layer 130 is disposed on the first to third color filters 122, 124 and 126. The second insulation layer 130 flattens, protects and insulates the first to third color filters 122, 124 and 126.

The first high pixel electrode 150h is disposed on the second insulation layer 130, and is electrically connected to the first high switching element SWh1. The first high pixel electrode 150h may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The first high pixel electrode 150h includes, for example, first and second stems, and branches (e.g., refers to FIG. 4). The branches of the first high pixel electrode 150h form, for example, a micro slit structure. The branch of the first high pixel electrode 150h is spaced apart from an adjacent branch by a first space S1, and has a first width W1. Thus, the branches have, for example, a first pitch P1 (P1=W1+S1).

The first low pixel electrode 150l is disposed on the second insulation layer 130, and is electrically connected to the first low switching element SWl1. The first low pixel electrode 150l may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The first low pixel electrode 150*l* includes, for example, first and second stems, and branches (e.g., refers to FIG. 4). The branches of the first low pixel electrode 150*l* form, for example, a micro slit structure. The branch of the first low pixel electrode 150*l* is spaced apart from an adjacent branch by a first space S1, and has a first width W1. Thus, the branches have, for example, a first pitch P1 (P1=W1+S1).

The second high pixel electrode 160*h* is disposed on the second insulation layer 130, and is electrically connected to the second high switching element SWh2. The second high pixel electrode 160*h* may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The second high pixel electrode 160*h* includes, for example, first and second stems, and branches (refers to FIG. 5). The branches of the second high pixel electrode 160*h* form, for example, a micro slit structure. The branch of the second high pixel electrode 160*h* is spaced apart from an adjacent branch by a second space S2, and has a second width W2. Thus, the branches have, for example, a second pitch P2 (P2=W2+S2).

The second low pixel electrode 160*l* is disposed on the second insulation layer 130, and is electrically connected to the second low switching element SWl2. The second low pixel electrode 160*l* may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The second low pixel electrode 160*l* includes, for example, first and second stems, and branches (refers to FIG. 5). The branches of the second low pixel electrode 160*l* form, for example, a micro slit structure. The branch of the second low pixel electrode 160*l* is spaced apart from an adjacent branch by a second space S2, and has a second width W2. Thus, the branches have, for example, a second pitch P2 (P2=W2+S2).

The third high pixel electrode 170*h* is disposed on the second insulation layer 130, and electrically connected to the third high switching electrode SWh3. The third high pixel electrode 170*h* may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The third high pixel electrode 170*h* includes, for example, first and second stems, and branches (e.g., refers to FIG. 5). The branches of the third high pixel electrode 170*h* form, for example, a micro slit structure. The branch of the third high pixel electrode 170*h* is spaced apart from an adjacent branch by a third space S3, and has a third width W3. Thus, the branches have, for example, a third pitch P3 (P3=W3+S3).

The third low pixel electrode 170*l* is disposed on the second insulation layer 130, and electrically connected to the third low switching electrode SWl3. The third low pixel electrode 170*l* may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO). The third low pixel electrode 170*l* includes, for example, first and second stems, and branches (e.g., refers to FIG. 5). The branches of the third low pixel electrode 170*l* form, for example, a micro slit structure. The branch of the third low pixel electrode 170*l* is spaced apart from an adjacent branch by a third space S3, and has a third width W3. Thus, the branches have, for example, a third pitch P3 (P3=W3+S3).

The black matrix BM is disposed on, for example, the second insulation layer 130 on which the first to third high and low pixel electrodes are disposed. The black matrix BM includes a light blocking martial. The black matrix BM may be disposed in, for example, a peripheral area adjacent to a display area on which an image is disposed. Thus, the black matrix BM may, for example, overlap the first to third high and low switching elements SWh1, SWl1, SWh2, SWl2, SWh3 and SWl3, the gate line GL, and the first to third high and low data lines DLh1, DLh2, DLh3, DLl1, DLl2 and DLl3.

The second substrate includes, for example, a second base substrate 200 and a common electrode 220.

The second base substrate 200 may include, for example, a material which has relatively high transmittance, thermal resistance, and chemical resistance. For example, the second base substrate 200 may include any one selected from the group consisting of glass, quartz, or plastic. Further, in an embodiment, the second base substrate 200 may be, for example, a flexible substrate. Suitable materials for the flexible substrate include, for example, polyethylenenaphthalate, polyethylene terephthalate, polyacryl, polyimide, polyethersulfone, polyvinyl chloride, and a mixture thereof.

The common electrode 220 is disposed on the second base substrate 200. The common electrode 220 may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO).

The liquid crystal layer 3 is disposed between the first substrate and the second substrate. The liquid crystal layer 3 includes liquid crystal molecules having optical anisotropy. The liquid crystal molecules are driven by electric field, so that an image is displayed by passing or blocking light through the liquid crystal layer 3.

FIGS. 13A to 13H are cross-sectional views illustrating a method of manufacturing the display panel of FIG. 1.

Figure 13A:
FIGS. 13A to 13H are cross-sectional views illustrating a method of manufacturing the display panel of FIG. 1.

Referring to FIG. 13A, a metal layer is formed on a first base substrate 100, and then the metal layer may be, for example, partially etched by a photolithography process or an etching process using an additional etching mask. Hence, a gate pattern is formed.

The gate pattern includes, for example, a gate line (e.g., refers to GL of FIG. 1), a first gate electrode (e.g., refers to GE1 of FIG. 2), a second gate electrode and a third gate electrode.

A first insulation layer 110 is formed on the first base substrate 100 on which the gate pattern is formed. The first insulation layer 110 may be formed by, for example, a spin coating process, a printing process, a sputtering process, a CVD process, an ALD process, a PECVD process, an HDP-CVD process or a vacuum evaporation process in accordance with ingredients included in first insulation layer 110.

Figure 13B:
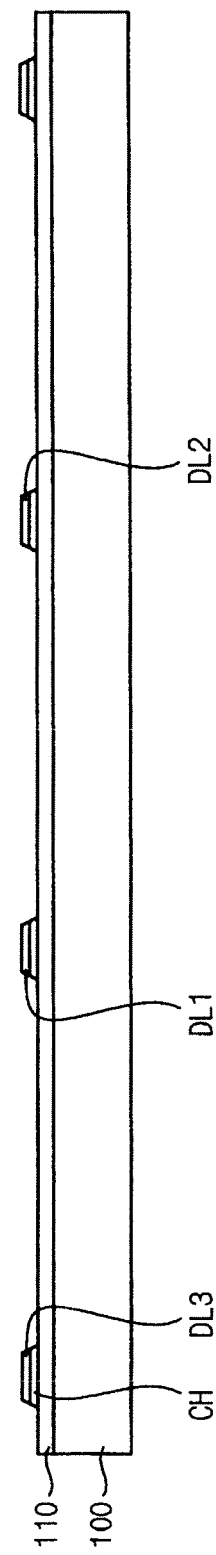

Referring to FIG. 13B, a semiconductor layer and a metal layer are formed on the first insulation layer 110, and then the semiconductor layer and the metal layer may be, for example, partially etched by a photolithography process or an etching process using an additional etching mask. Hence, a channel layer CH including, for example, first to third channel portions and a data pattern are formed. The semiconductor layer may include, for example, a silicon semiconductor layer consisting of amorphous silicon (a-Si:H) and an ohmic contact layer consisting of n+ amorphous silicon (n+ a-Si:H). In addition, the semiconductor layer may include, for example, an oxide semiconductor. The oxide semiconductor may include, for example, an amorphous oxide including at least one selected from the group consisting of indium (In), zinc (Zn), gallium (Ga), tin (Sn) and hafnium (Hf).

The data pattern includes, for example, first to third drain electrodes, first to third source electrodes and first to third data lines DL1, DL2 and DL3. For example, the semiconductor layer and the metal layer are patterned at the same time, and then a portion of the metal layer, which is patterned, is removed. Hence, the first source electrode and the first drain electrode spaced apart from the first source electrode may be formed by, for example, removing a portion of the patterned metal layer. In addition, the second source electrode and the second drain electrode spaced apart from the second source electrode may be formed by, for example, removing a portion of the patterned metal layer. In addition, the third source electrode and the third drain electrode spaced apart from the third source electrode may be formed by, for example, removing a portion of the patterned metal layer.

The first drain electrode, the first source electrode, the first channel portion and the first gate electrode form a first switching element (e.g., refers to SW1 of FIG. 1).

The second drain electrode, the second source electrode, the second channel portion and the second gate electrode form a second switching element (e.g., refers to SW2 of FIG. 1).

The third drain electrode, the third source electrode, the third channel portion and the third gate electrode form a third switching element (e.g., refers to SW3 of FIG. 1).

Figure 13C:
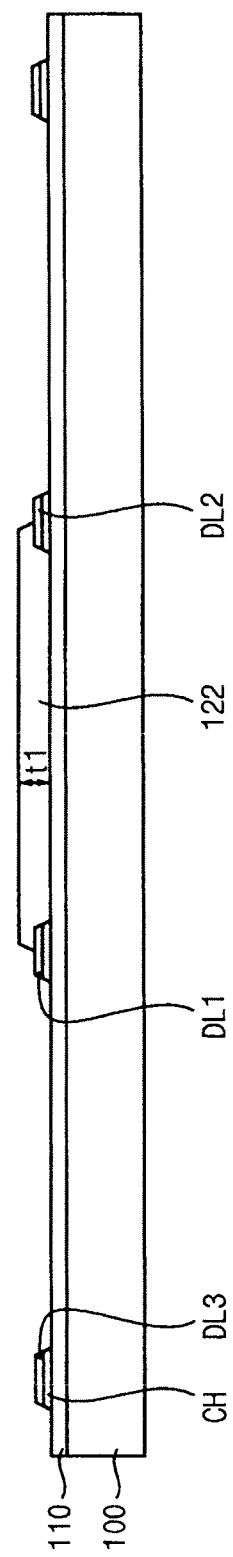

Referring to FIG. 13C, a first color filter 122 is formed on the first insulation layer 110 on which the data pattern is formed. The first color filter 122 includes a first color. For example, the first color filter 122 may be a red color filter which passes a red light. The first color filter 122 has a first thickness t1.

Figure 13D:
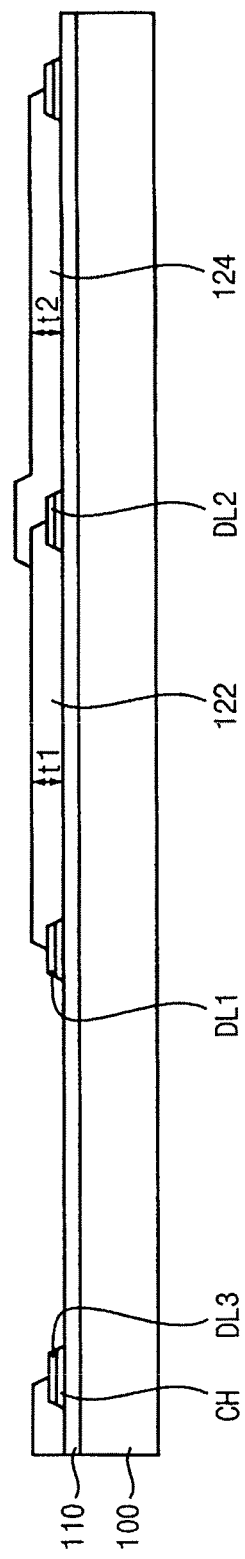

Referring to FIG. 13D, a second color filter 124 is formed on the first insulation layer 110 on which the first color filter 122 is formed. The second color filter 124 may have a second color. For example, the second color filter 124 may be a green color filter which passes a green light. The second color filter 124 has a second thickness t2. The first color filter 122 and the second color filter 124 may, for example, be overlapped with each other.

Figure 13E:
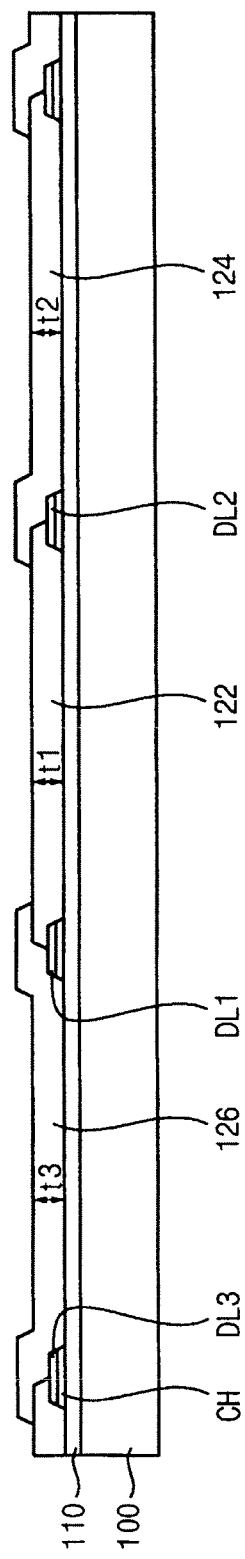

Referring to FIG. 13E, a third color filter 126 is formed on the first insulation layer 110 on which the first and second color filters 122 and 124 are formed. The third color filter 126 may have a third color. For example, the third color filter 126 may be a blue color filter which passes a blue light. The third color filter 126 has a third thickness t3. The third color filter 126 may, for example, partially overlap the first color filter 122. In addition, the third color filter 126 may, for example, partially overlap a second color filter 122 of an adjacent pixel.

Figure 13F:
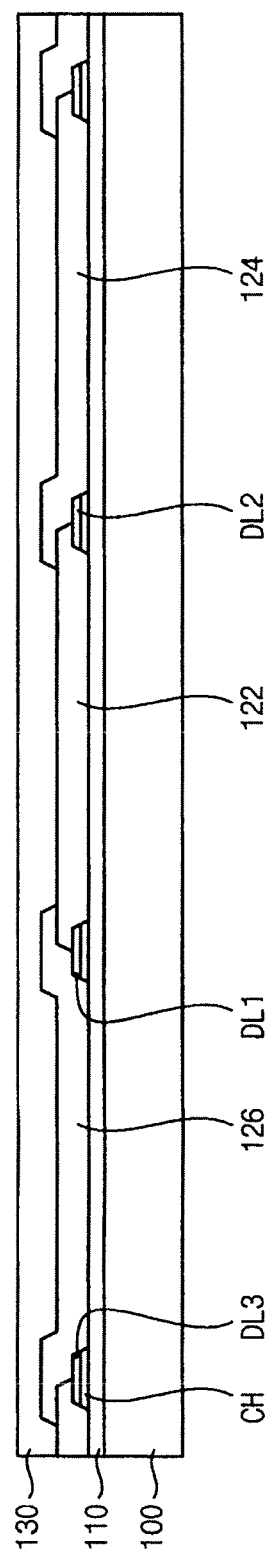

Referring to FIG. 13F, a second insulation layer 130 is formed on the first to third color filters 122, 124 and 136. The second insulation layer 130 flattens, protects and insulates the first to third color filters 122, 124 and 126. A first contact hole (e.g., refers to H1 of FIG. 1), a second contact hole (e.g., refers to H2 of FIG. 1), and a third contact hole (e.g., refers to H3 of FIG. 1) are formed through the second insulation layer 130. The first contact hole exposes the first drain electrode of the first switching element. The second contact hole exposes the second drain electrode of the second switching element. The third contact hole exposes the third drain electrode of the third switching element.

Figure 13G:
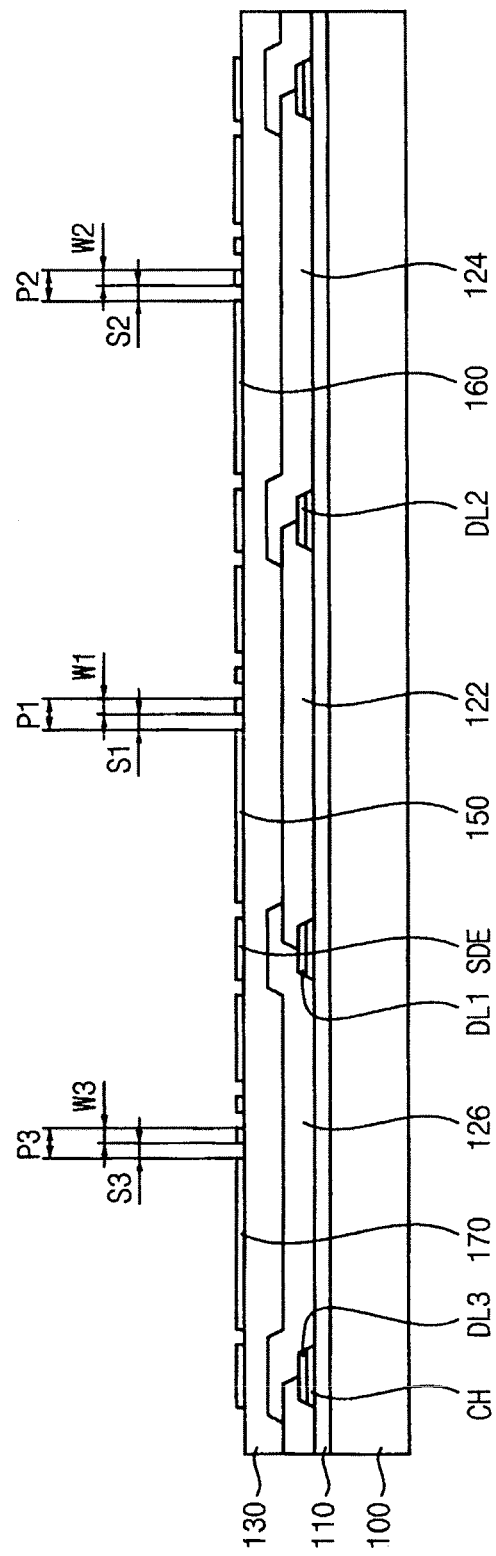

Referring to FIG. 13G, a transparent conductive layer is formed on the second insulation layer 130, and then transparent conductive layer may, for example, be partially etched by a photolithography process or an etching process using an additional etching mask. Hence, a first pixel electrode 150, a second pixel electrode 160, a third pixel electrode 170 and a shielding electrode SDE are formed. The transparent conductive layer may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO).

The first pixel electrode 150 is electrically connected to the first drain electrode of the first switching element through the first contact hole. The first pixel electrode 150 includes, for example, first and second stems and branches (e.g., refers to FIG. 4). The branches of the first pixel electrode 150 may form, for example, a micro slit structure. The branch of the first pixel electrode 150 is spaced apart from an adjacent branch by a first space S1, and has a first width W1. Thus, the branches have, for example, a first pitch P1 (P1=W1+S1).

The second pixel electrode 160 is electrically connected to the second drain electrode of the second switching element through the second contact hole. The second pixel electrode 160 includes, for example, first and second stems and branches (refers to FIG. 5). The branches of the second pixel electrode 160 may form, for example, a micro slit structure. The branch of the second pixel electrode 160 is spaced apart from an adjacent branch by a second space S2, and has a second width W2. Thus, the branches have, for example, a second pitch P2 (P2=W2+S2).

The third pixel electrode 170 is electrically connected to the third drain electrode of the third switching element through the third contact hole. The third pixel electrode 170 includes, for example, first and second stems and branches (e.g., refers to FIG. 5). The branches of third pixel electrode 170 may form, for example, a micro slit structure. The branch of third pixel electrode 170 is spaced apart from an adjacent branch by a third space S3, and has a third width W3. Thus, the branches have, for example, a third pitch P3 (P3=W3+S3).

Figure 13H:
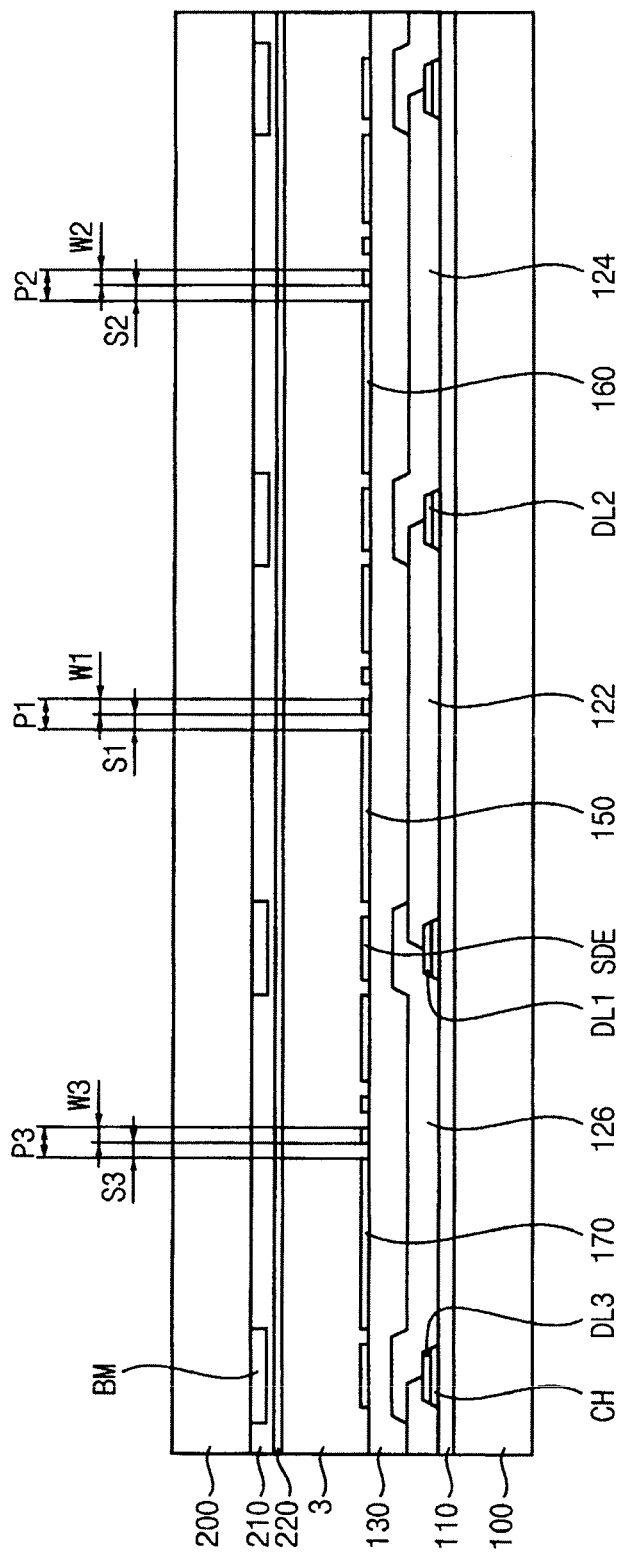

Referring to FIG. 13H, a black matrix BM is formed on, for example, a second substrate 200. The black matrix BM includes a light blocking material. The black matrix BM may be disposed, for example, in a peripheral area adjacent to a display area on which an image is disposed.

An over-coating layer 210 is formed on the second base substrate 200 on which the black matrix BM is formed. The over-coating layer 210 protects the black matrix BM. The over-coating layer 210 may include, for example, an acrylic-epoxy material.

A common electrode 220 may be disposed on the over-coating layer 210. The common electrode 220 may include, for example, a transparent conductive material, such as indium tin oxide (ITO), indium zinc oxide (IZO), aluminum doped zinc oxide (AZO), cadmium zinc oxide (CZO) or amorphous indium tin oxide (a-ITO).

The first base substrate 100, the gate pattern, the first insulation layer 110, the channel layer CH, the data pattern, the first to third color filters 122, 124 and 126, the second insulation layer 130, the first to third pixel electrodes 150, 160 and 170 compose a first substrate. The second base substrate 200, the black matrix BM, the over-coating layer 210 and the common electrode 220 compose a second substrate facing the first substrate.

A liquid crystal layer 3 is formed between the first substrate and the second substrate. The liquid crystal layer 3 includes liquid crystal molecules having optical anisotropy.

According to exemplary embodiments of the present invention, a display panel includes a first pixel electrode including branches having a first width, a second pixel electrode including branches having a second width, and a third pixel electrode including branches having a third width. The first width is smaller than the second or third width, so that a texture formed at the boundary of the first pixel electrode may be decreased. Thus, the display quality of the display panel may be increased.

In addition, the display panel includes a first color filter corresponding to the first pixel electrode, a second color filter corresponding to the second pixel electrode and a third color filter corresponding to the third pixel electrode. The first width of the first pixel electrode is smaller than the second width of the second electrode or the third width of the third electrode, so that a texture formed at the boundary of the first pixel electrode may be decreased. Thus, display quality of the display panel may be increased.

In addition, a boundary shape of the first to third pixel electrodes has an open or closed structure, so that a texture at a display area of the display panel may be decreased. Thus, the display quality of the display panel may be increased.

In addition, the first to third pixel electrodes include a sloped side having a first angle at a boundary of the pixel electrode, so that a texture at a display area of the display panel may be decreased. Thus, the display quality of the display panel may be increased.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:
1. A display panel comprising:
 a first data line;
 a second data line spaced apart from the first data line;
 a third data line spaced apart from the first data line;
 a first switching electrode electrically connected to the first data line;
 a second switching electrode electrically connected to the second data line;
 a third switching electrode electrically connected to the third data line;
 a first pixel electrode electrically connected to the first switching electrode, and comprising a plurality of first branches forming micro slits;
 a second pixel electrode electrically connected to the second switching electrode, and comprising a plurality of second branches forming micro slits; and
 a third pixel electrode electrically connected to the third switching electrode, and comprising a plurality of third branches forming micro slits,
 wherein the first branches are spaced apart from each other by a first space, and have a first width,
 wherein the second branches are spaced apart from each other by a second space, and have a second width,
 wherein the third branches are spaced apart from each other by a third space, and have a third width,
 wherein at least one of the first width, the second width and the third width is different from the other widths, and
 wherein the first width is smaller than the second width and the third width.

2. The display panel of claim 1, wherein the second width is substantially the same as the third width.

3. The display panel of claim 2, wherein a first pitch is defined by a sum of the first space and the first width, a second pitch is defined by a sum of the second space and the second width, a third pitch is defined by a sum of the third space and the third width, and wherein the first pitch, the second pitch and the third pitch are substantially the same as each other.

4. The display panel of claim 2, wherein the first pitch, the second pitch and the third pitch are each about 6 micrometers (μm), and wherein the first width is about 3.4 μm, and the second width and the third width are each about 3.5 μm.

5. The display panel of claim 1, wherein the first pixel electrode comprises a first stem extending in a first direction and a second stem crossing the first stem and extending in a second direction which is substantially perpendicular to the first direction, wherein the first branches extend from the first stem or the second stem in a third direction which is different from the first and second directions, wherein the second pixel electrode comprises a first stem extending in the first direction and a second stem crossing the first stem and extending in the second direction, wherein the second branches extend from the first stem or the second stem in the third direction, wherein the third pixel electrode comprises a first stem extending in the first direction and a second stem crossing the first stem and extending in the second direction, and wherein the third branches extend from the first stem or the second stem in the third direction.

6. The display panel of claim 5, wherein ends of an adjacent pair of the first branches are connected with each other at a boundary of the first pixel electrode such that the ends of the adjacent pair of first branches form a closed structure.

7. The display panel of claim 5, wherein ends of an adjacent pair of the first branches at a boundary of the first pixel electrode are spaced apart from each other such that the ends of the adjacent pair of the first branches form an opened structure.

8. The display panel of claim 6, wherein the first branches of the closed structure adjacent to each other form an opening, and wherein a side of opening which is adjacent to the boundary of the first pixel electrode makes a first angle with a line which extends along the boundary of the first pixel electrode.

9. The display panel of claim 1, further comprising:
 a first color filter overlapping with the first pixel electrode and having a first color;
 a second color filter overlapping with the second pixel electrode and having a second color different from the first color; and
 a third color filter overlapping with the third pixel electrode and having a third color different from the first color and the second color.

10. The display panel of claim 9, wherein a boundary of the second color filter overlaps with a first boundary of the first color filter, wherein a boundary of the third color filter overlaps with a second boundary of the first color filter, and wherein the second boundary is disposed opposite to the first boundary of the first color filter.

11. The display panel of claim 10, wherein the first color of the first color filter is red.

12. The display panel of claim 11, wherein the first color filter has a first thickness, the second color filter has a second thickness, and the third color filter has a third thickness, and wherein the first thickness is smaller than the second thickness and the third thickness.

13. The display panel of claim 1, wherein the first data line comprises a first high data line and a first low data line, the second data line comprises a second high data line and a second low data line, the third data line comprises a third high data line and a third low data line, wherein the first switching element comprises a first high switching element electrically connected to the first high data line and a first low switching element electrically connected to the first low data line, the second switching element comprises a second high switching element electrically connected to the second high data line and a second low switching element electrically connected to the second low data line, the third switching element comprises a third high switching element electrically connected to the third high data line and a third low switching element electrically connected to the third low data line, wherein the first pixel electrode comprises a first high pixel electrode electrically connected to the first high switching element and a first low pixel electrode electrically connected to the first low switching element, wherein the second pixel electrode comprises a second high pixel electrode electrically connected to the second high switching element and a second low pixel electrode electrically connected to the second low switching element, and wherein the third pixel electrode comprises a third high pixel electrode electrically connected to the third high switching element and a third low pixel electrode electrically connected to the third low switching element.

14. The display panel of claim 1, further comprises a shielding electrode disposed between the first pixel electrode, the second pixel electrode and the third pixel electrode, wherein the shielding electrode overlaps with the first data line, the second data line and the third data line.

15. A method of manufacturing a display panel comprising:
forming a first switching element, a second switching element and a third switching element on a base substrate; and
forming a first pixel electrode, a second pixel electrode, and a third pixel electrode which are respectively connected to the first switching element, the second switching element and the third switching element on the base substrate on which the first switching element, the second switching element, and the third switching element are formed,
wherein the first pixel electrode comprises a plurality of first branches having a first width, the first branches are spaced apart from each other by a first space,
wherein the second pixel electrode comprises a plurality of second branches having a second width, the second branches are spaced apart from each other by a second space,
wherein the third pixel electrode comprises a plurality of third branches having a third width, the third branches are spaced apart from each other by a third space, and
wherein the first width is smaller than the second width and the third width.

16. The method of claim 15, wherein ends of an adjacent pair of the first branches are connected with each other at a boundary of the first pixel electrode such that the ends of the adjacent pair of the first branches form a closed structure.

17. The method of claim 15, wherein ends of an adjacent pair of the first branches at a boundary of the first pixel electrode are spaced apart from each other such that the ends of the adjacent pair of the first branches form an opened structure.

18. The method of claim 15, wherein before the forming of the first pixel electrode, the second pixel electrode and the third pixel electrode, the method further comprising:
forming a first color filter corresponding to the first pixel electrode on the base substrate on which the first pixel electrode, the second pixel electrode, and the third pixel electrode are formed, the first color filter having a first color;
forming a second color filter corresponding to the second pixel electrode on the base substrate on which the first color filter is formed, the second color filter having a second color; and
forming a third color filter corresponding to the third pixel electrode on the base substrate on which the first color filter and the second color filter are formed, the third color filter having a second color.

19. The method of claim 18, wherein a boundary of the second color filter overlaps with a first boundary of the first color filter, wherein a boundary of the third color filter overlaps with a second boundary of the first color filter, and wherein the second boundary is disposed opposite to the first boundary of the first color filter.

20. The method of claim 19, wherein the first color filter has a first thickness, the second color filter has a second thickness, and the third color filter has a third thickness, and wherein the first thickness is smaller than the second thickness and the third thickness.

21. A display panel comprising:
a first data line;
a second data line spaced apart from the first data line;
a third data line spaced apart from the first data line; a first switching electrode electrically connected to the first data line;
a second switching electrode electrically connected to the second data line;
a third switching electrode electrically connected to the third data line;
a first pixel electrode electrically connected to the first switching electrode, and comprising a plurality of first branches forming micro slits, wherein the first branches include a first sub-branch and a second sub-branch connected to each other at a boundary of the first pixel electrode such that a first opening is defined between the first sub-branch and the second sub-branch and wherein a side of the first opening which is adjacent to the boundary of the first pixel electrode makes a first angle with a line extending along the boundary of the first pixel electrode, wherein the first sub-branches and the second sub-branches of the first branches of the first pixel electrode are spaced apart from adjacent first and second sub-branches of the first pixel electrode by a first space, and have a first width;
a second pixel electrode electrically connected to the second switching electrode, and comprising a plurality of second branches forming micro slits, wherein the second branches include a first sub-branch and a second sub-branch connected to each other at a boundary of the second pixel electrode such that a second opening is defined between the first sub-branch and the second sub-branch and wherein a side of the second opening which is adjacent to the boundary of the second pixel electrode makes a second angle with a line extending along the boundary of the second pixel electrode, wherein the first sub-branches and the second sub-branches of the second branches of the second pixel electrode are spaced apart from adjacent first and second sub-branches of the second pixel electrode by a second space, and have a second width; and a third pixel electrode electrically connected to the third switching electrode, and comprising a plurality of third branches forming micro slits, wherein the third branches include a first sub-branch and a second sub-branch connected to each other at a boundary of the third pixel electrode such that a third opening is defined between the first sub-branch and the second sub-branch and wherein a side of the third opening which is adjacent to the boundary of the third pixel electrode makes a third angle with a line extending along the boundary of the third pixel electrode, wherein the first sub-branches and the second sub-branches of the third branches of the third pixel electrode are spaced apart from adjacent first and second sub-branches of the third pixel electrode by a third space, and have a third width, wherein at least one of the first width, the second width and the third width is different from the other widths, and wherein the first width is smaller than the second width and the third width.

22. The display panel of claim 21, wherein the first branches of the first pixel electrode further include a third-sub branch, wherein the first sub-branch, the second sub-branch and the third sub-branch of the first pixel electrode are connected to each other at the boundary of the first pixel electrode, such that the first opening is defined between the first and second sub-branches of the first pixel electrode and a fourth opening is defined between the second sub-branch and the third sub-branch of the first pixel electrode.

23. The display panel of claim 22, wherein the first branches of the first pixel electrode further include a fourth-sub branch, wherein the first sub-branch, the second sub-branch, the third sub-branch and the fourth sub-branch of the first pixel electrode are connected to each other at the boundary of the first pixel electrode, such that the first opening is defined between the first and second sub-branches of the first pixel electrode, the fourth opening is defined between the second sub-branch and the third sub-branch of the first pixel electrode and a fifth opening is defined between the third sub-branch and the fourth sub-branch of the first pixel electrode.

* * * * *